(12) United States Patent
Murayama et al.

(10) Patent No.: US 11,978,501 B2
(45) Date of Patent: May 7, 2024

(54) SEMICONDUCTOR MEMORY DEVICE AND METHOD

(71) Applicant: Kioxia Corporation, Tokyo (JP)

(72) Inventors: Akiyuki Murayama, Tokyo (JP); Kikuko Sugimae, Yokohama Kanagawa (JP); Katsuya Nishiyama, Yokohama Kanagawa (JP); Yusuke Arayashiki, Kawasaki Kanagawa (JP); Motohiko Fujimatsu, Shinagawa Tokyo (JP); Kyosuke Sano, Kamakura Kanagawa (JP); Noboru Shibata, Kawasaki Kanagawa (JP)

(73) Assignee: Kioxia Corporation, Tokyo (JP)

( * ) Notice: Subject to any disclaimer, the term of this patent is extended or adjusted under 35 U.S.C. 154(b) by 147 days.

(21) Appl. No.: 17/842,516

(22) Filed: Jun. 16, 2022

(65) Prior Publication Data
US 2023/0253029 A1 Aug. 10, 2023

(30) Foreign Application Priority Data
Feb. 10, 2022 (JP) .................. 2022-019173

(51) Int. Cl.
| | | |
|---|---|---|
| G11C 11/00 | (2006.01) | |
| G11C 5/06 | (2006.01) | |
| G11C 11/4074 | (2006.01) | |
| G11C 11/408 | (2006.01) | |
| G11C 11/4099 | (2006.01) | |

(52) U.S. Cl.
CPC .......... *G11C 11/4085* (2013.01); *G11C 5/063* (2013.01); *G11C 11/4074* (2013.01); *G11C 11/4099* (2013.01)

(58) Field of Classification Search
CPC ...... G11C 2211/562; G11C 2211/5641; G11C 2211/5648; G11C 16/26; G11C 16/3404
See application file for complete search history.

(56) References Cited

U.S. PATENT DOCUMENTS

| | | | |
|---|---|---|---|
| 8,681,543 B2 * | 3/2014 | Jang ................... | G11C 16/0483 365/185.18 |
| 2018/0204624 A1 * | 7/2018 | Yoon .................... | G11C 29/028 |
| 2021/0020655 A1 | 1/2021 | Yoshimura et al. | |
| 2022/0199173 A1 * | 6/2022 | Nguyen ............... | G11C 7/1087 |

FOREIGN PATENT DOCUMENTS

JP 2021-019083 A 2/2021

\* cited by examiner

*Primary Examiner* — Uyen Smet
(74) *Attorney, Agent, or Firm* — Foley & Lardner LLP

(57) ABSTRACT

According to an embodiment, a circuit in a semiconductor memory device sets threshold voltages of a plurality of memory cells such that two first distributions are formed in a first section on a lowest voltage side in $2^N$ sections. After that, the circuit sets threshold voltages of the plurality of memory cells such that $2^{(1+M)}$ second distributions are separately formed two by two. The circuit then sets $2^N$ third distributions for the $2^N$ sections.

16 Claims, 18 Drawing Sheets

FIG.10

| | LOWER PAGE | MIDDLE PAGE | UPPER PAGE | TOP PAGE |
|---|---|---|---|---|
| S0 | 1 | 1 | 1 | 1 |
| S1 | 1 | 1 | 1 | 0 |
| S2 | 1 | 1 | 0 | 0 |
| S3 | 1 | 1 | 0 | 1 |
| S4 | 0 | 1 | 0 | 1 |
| S5 | 0 | 1 | 0 | 0 |
| S6 | 0 | 1 | 1 | 0 |
| S7 | 0 | 1 | 1 | 1 |
| S8 | 0 | 0 | 1 | 1 |
| S9 | 0 | 0 | 1 | 0 |
| S10 | 0 | 0 | 0 | 0 |
| S11 | 0 | 0 | 0 | 1 |
| S12 | 1 | 0 | 0 | 1 |
| S13 | 1 | 0 | 0 | 0 |
| S14 | 1 | 0 | 1 | 0 |
| S15 | 1 | 0 | 1 | 1 |

STORED IN ST2 | STORED IN ST1 | STORED IN ST3

FIG.13

| WL | SU 0 | 1 | 2 | 3 | 4 | 5 | 6 | 7 | ... | 15 |
|---|---|---|---|---|---|---|---|---|---|---|
| WLDD0 | | | | | | | | | | |
| WLDD1 | | | | | | | | | | |
| WLDD2 | | | | | | | | | | |
| WL63 | SLC | SLC | SLC | SLC | SLC | SLC | SLC | SLC | | SLC |
| WL62 | SLC | SLC | SLC | SLC | SLC | SLC | SLC | SLC | | SLC |
| ... | | | | | | | | | | |
| WL5 | SLC | SLC | SLC | SLC | SLC | SLC | SLC | SLC | | SLC |
| WL4 | SLC | SLC | SLC | SLC | SLC | SLC | SLC | SLC | | SLC |
| WL3 | SLC | SLC | SLC | SLC | SLC | SLC | SLC | SLC | | SLC |
| WL2 | SLC | SLC | SLC | SLC | SLC | SLC | SLC | SLC | | SLC |
| WL1 | SLC | SLC | SLC | SLC | SLC | SLC | SLC | SLC | | SLC |
| WL0 | TLC | TLC | TLC | TLC | TLC | SLC | SLC | SLC | | SLC |

UNREADABLE

FIG.14

| WL | SU 0 | 1 | 2 | 3 | 4 | 5 | 6 | 7 | ... | 15 |
|---|---|---|---|---|---|---|---|---|---|---|
| WLDD0 | SLC | SLC | SLC | SLC | SLC | SLC | SLC | SLC | | SLC |
| WLDD1 | SLC | SLC | SLC | SLC | SLC | SLC | SLC | SLC | | SLC |
| WLDD2 | SLC | SLC | SLC | SLC | SLC | SLC | SLC | SLC | | SLC |
| WL63 | SLC | SLC | SLC | SLC | SLC | SLC | SLC | SLC | | SLC |
| WL62 | SLC | SLC | SLC | SLC | SLC | SLC | SLC | SLC | | SLC |
| ... | | | | | | | | | | |
| WL5 | SLC | SLC | SLC | SLC | SLC | SLC | SLC | SLC | | SLC |
| WL4 | SLC | SLC | SLC | SLC | SLC | SLC | SLC | SLC | | SLC |
| WL3 | SLC | SLC | SLC | SLC | SLC | SLC | SLC | SLC | | SLC |
| WL2 | SLC | SLC | SLC | SLC | SLC | SLC | SLC | SLC | | SLC |
| WL1 | TLC | TLC | TLC | TLC | TLC | TLC | TLC | TLC | | TLC |
| WL0 | TLC | TLC | TLC | TLC | TLC | TLC | TLC | TLC | | TLC |

UNREADABLE

FIG.15

| WL | SU 0 | 1 | 2 | 3 | 4 | 5 | 6 | 7 | ... | 15 |
|---|---|---|---|---|---|---|---|---|---|---|
| WLDD0 | SLC | SLC | SLC | SLC | SLC | SLC | SLC | SLC | | SLC |
| WLDD1 | SLC | SLC | SLC | SLC | SLC | SLC | SLC | SLC | | SLC |
| WLDD2 | SLC | SLC | SLC | SLC | SLC | SLC | SLC | SLC | | SLC |
| WL63 | SLC | SLC | SLC | SLC | SLC | SLC | SLC | SLC | | SLC |
| WL62 | SLC | SLC | SLC | SLC | SLC | SLC | SLC | SLC | | SLC |
| ... | | | | | | | | | | |
| WL5 | SLC | SLC | SLC | SLC | SLC | SLC | SLC | SLC | | SLC |
| WL4 | SLC | SLC | SLC | SLC | SLC | SLC | SLC | SLC | | SLC |
| WL3 | SLC | SLC | SLC | SLC | SLC | SLC | SLC | SLC | | SLC |
| WL2 | SLC | SLC | SLC | SLC | SLC | SLC | SLC | SLC | | SLC |
| WL1 | TLC | TLC | TLC | TLC | TLC | TLC | TLC | TLC | | TLC |
| WL0 | QLC | QLC | QLC | TLC | TLC | TLC | TLC | TLC | | TLC |

WL2 (dashed): UNREADABLE

FIG.16

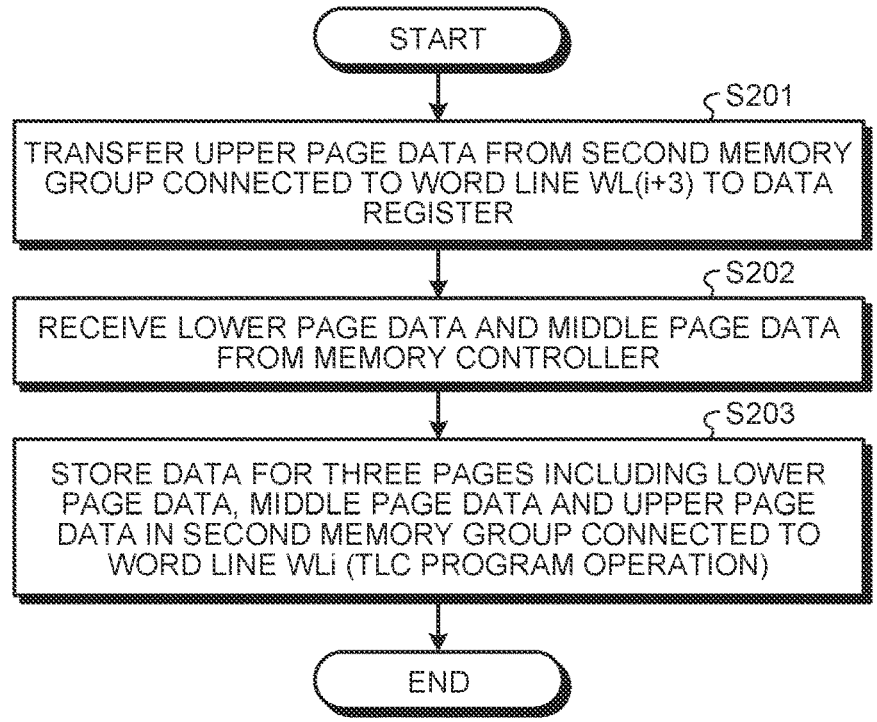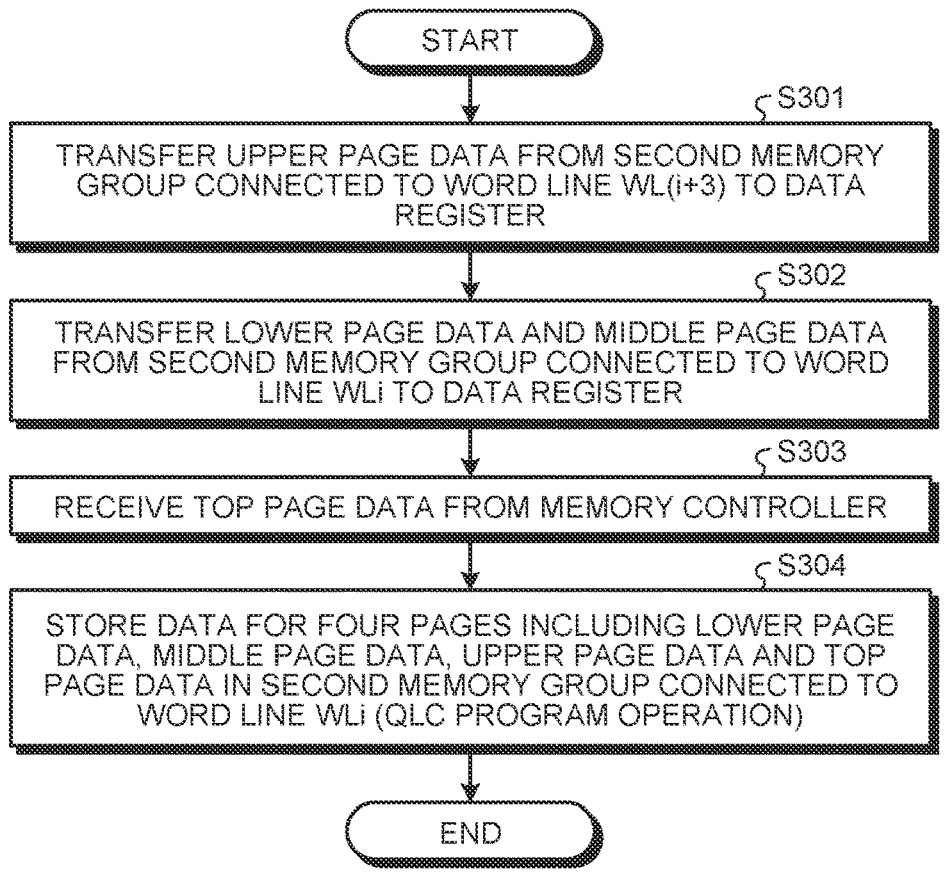

FIG.19

| | BASE PAGE | LOWER PAGE | MIDDLE PAGE | UPPER PAGE | TOP PAGE |
|---|---|---|---|---|---|
| S0 | 1 | 1 | 1 | 1 | 1 |
| S1 | 1 | 1 | 1 | 1 | 0 |
| S2 | 1 | 1 | 1 | 0 | 0 |
| S3 | 1 | 1 | 1 | 0 | 1 |
| S4 | 1 | 1 | 0 | 0 | 1 |
| S5 | 1 | 1 | 0 | 1 | 1 |
| S6 | 1 | 1 | 0 | 1 | 0 |
| S7 | 1 | 1 | 0 | 0 | 0 |
| S8 | 0 | 1 | 0 | 0 | 0 |
| S9 | 0 | 1 | 0 | 0 | 1 |
| S10 | 0 | 1 | 0 | 1 | 1 |
| S11 | 0 | 1 | 0 | 1 | 0 |
| S12 | 0 | 1 | 1 | 1 | 0 |
| S13 | 0 | 1 | 1 | 0 | 0 |
| S14 | 0 | 1 | 1 | 0 | 1 |
| S15 | 0 | 1 | 1 | 1 | 1 |
| S16 | 0 | 0 | 1 | 1 | 1 |
| S17 | 0 | 0 | 1 | 1 | 0 |
| S18 | 0 | 0 | 1 | 0 | 0 |
| S19 | 0 | 0 | 1 | 0 | 1 |
| S20 | 0 | 0 | 0 | 0 | 1 |
| S21 | 0 | 0 | 0 | 1 | 1 |
| S22 | 0 | 0 | 0 | 1 | 0 |
| S23 | 0 | 0 | 0 | 0 | 0 |
| S24 | 1 | 0 | 0 | 0 | 0 |
| S25 | 1 | 0 | 0 | 0 | 1 |
| S26 | 1 | 0 | 0 | 1 | 1 |
| S27 | 1 | 0 | 0 | 1 | 0 |
| S28 | 1 | 0 | 1 | 1 | 0 |
| S29 | 1 | 0 | 1 | 0 | 0 |
| S30 | 1 | 0 | 1 | 0 | 1 |
| S31 | 1 | 0 | 1 | 1 | 1 |

STORED IN ST2 (BASE PAGE, LOWER PAGE) | STORED IN ST1 (MIDDLE PAGE, UPPER PAGE) | STORED IN ST3 (TOP PAGE)

SEMICONDUCTOR MEMORY DEVICE AND METHOD

CROSS-REFERENCE TO RELATED APPLICATIONS

This application is based upon and claims the benefit of priority from Japanese Patent Application No. 2022-019173, filed on Feb. 10, 2022; the entire contents of which are incorporated herein by reference.

FIELD

Embodiments described herein relate generally to a semiconductor memory device and a method.

BACKGROUND

As a semiconductor memory device, a NAND flash memory capable of storing data of many bits per one memory cell has been known. In such a NAND flash memory, a program operation on one memory cell may be performed by separating the program operation into plural stages. Such a series of plural-stage program operations is referred to as a multi-stage program operation.

An example of the multi-stage program operation is a foggy-fine program operation. According to the foggy-fine program operation, data of all bits is coarsely programmed in a first memory cell, data of all bits is coarsely programmed in a second memory cell adjacent to the first memory cell, and data of all bits is precisely reprogrammed in the first memory cell. In other words, according to the foggy-fine program operation, a first-stage program operation in which data of all bits is coarsely programmed and a second-stage program operation in which data of all bits is precisely reprogrammed are performed for each memory cell. According to the foggy-fine program operation, a shift amount of a threshold voltage of each memory cell can be reduced in the second-stage program operation, and thus a decrease in data reliability due to inter-cell interference can be suppressed.

However, according to the foggy-fine program operation, it is necessary for a memory controller to hold data of all bits to be programmed in the first memory cell until the second-stage program operation on the first memory cell is performed after the first-stage program operation on the first memory cell is completed. Therefore, it is required to install a large-capacity buffer memory in the memory controller, which may bring disadvantage in terms of cost.

BRIEF DESCRIPTION OF THE DRAWINGS

FIG. 10 is a diagram illustrating an example of coding of the embodiment that enables the multi-stage program operation illustrated in FIG. 9;

FIG. 13 is a diagram for explaining an example of the order of execution of the second-stage program operation by the semiconductor memory device according to the embodiment;

FIG. 14 is a diagram for explaining an example of the order of execution of the second-stage program operation by the semiconductor memory device according to the embodiment;

FIG. 15 is a diagram for explaining an example of the order of execution of the second-stage program operation and the third-stage program operation by the semiconductor memory device according to the embodiment;

FIG. 16 is a diagram for explaining an example of the order of execution of the second-stage program operation and the third-stage program operation by the semiconductor memory device according to the embodiment;

FIG. 17 is a flowchart illustrating an example of a series of processes related to a TLC program operation on one second memory group performed by the semiconductor memory device according to the embodiment;

FIG. 18 is a flowchart illustrating an example of a series of processes related to a QLC program operation on one second memory group performed by the semiconductor memory device according to the embodiment; and FIG. 19 is a diagram illustrating an example of coding that enables a multi-stage program operation according to the embodiment when the PLC method is applied.

DETAILED DESCRIPTION

Figure 1:
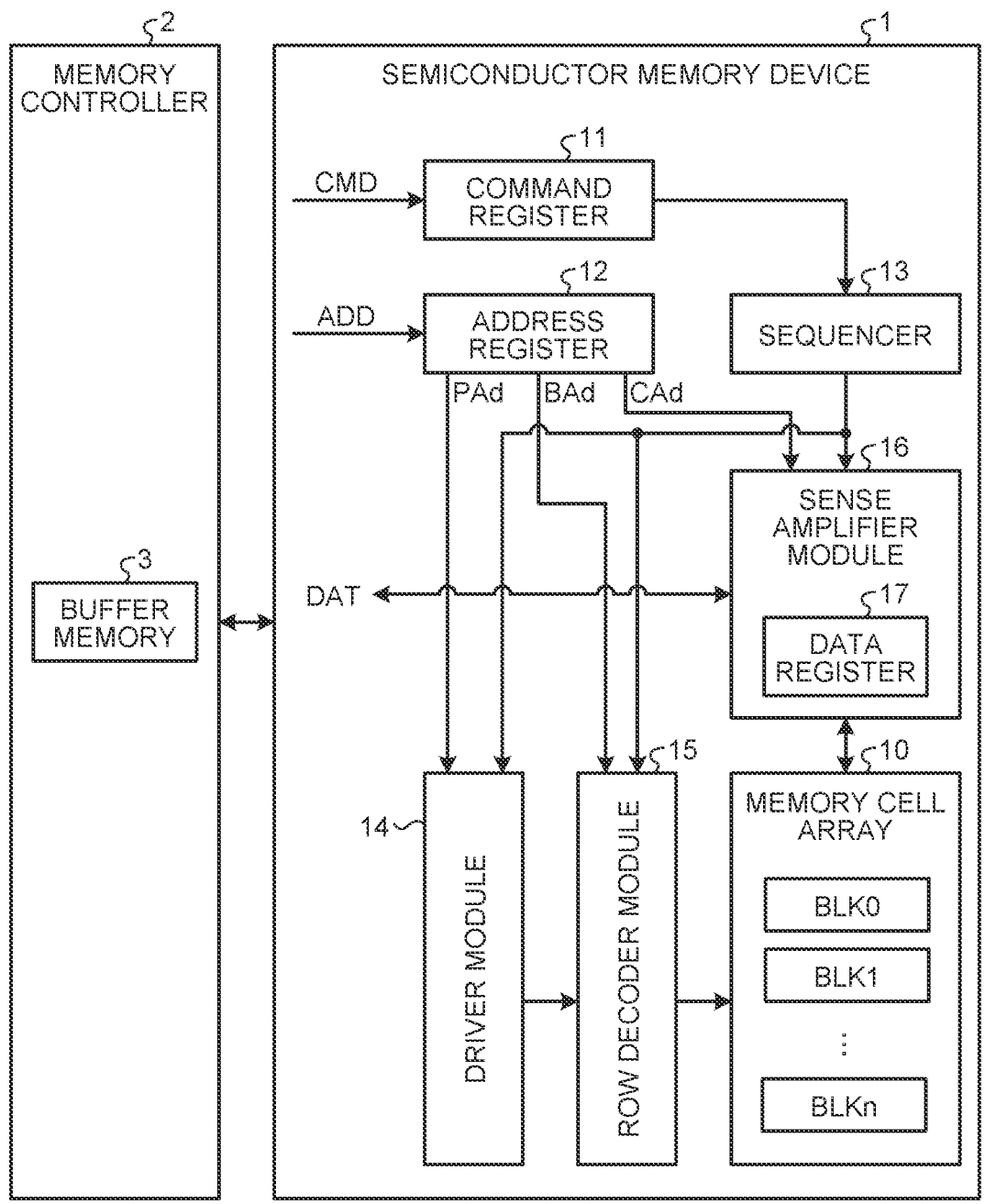
FIG. 1 is a schematic diagram illustrating a configuration example of a semiconductor memory device according to an embodiment.

According to the present embodiment, a semiconductor memory device includes a plurality of memory cell groups, a plurality of first word lines, and a circuit. Each memory cell is configured to store data of N bits corresponding to $2^N$ sections in which a threshold voltage is set. Each first word line is connected to any one of the plurality of memory cell groups. The circuit is configured to perform a first operation on the plurality of memory cell groups. The first operation includes: receiving first data of 1 bit per memory cell from an outside; and setting threshold voltages of a plurality of memory cells such that two separated first distributions corresponding to the first data are formed in a first section on a lowest voltage side in the $2^N$ sections. After the first operation on the plurality of memory cell groups, the circuit performs a second operation on a memory cell group connected to each of two second word lines adjacent to each other in the plurality of first word lines. The second operation includes: reading, on the basis of the two first distributions, second data of 1 bit per memory cell from a memory cell group connected to a fourth word line which is a first word line three or more away from a third word line which is one of the two second word lines in the plurality of first word lines; receiving third data of M (where 1+M<N) bits per memory cell from an outside; and setting threshold voltages of a plurality of memory cells included in a memory cell group connected to the third word line such that $2^{(1+M)}$ second distributions corresponding to fourth data of (1+M) bits are separately formed two by two per memory cell including the second data and the third data. After the second operation on a memory cell group connected to each of the two second word lines, the circuit performs a third operation on a memory cell group connected to a fifth word line which is one of the two second word lines. The third operation includes: reading fifth data of 1 bit per memory cell on the basis of the two first distributions from a sixth word line which is a first word line three or more away from the fifth word line in the plurality of first word lines; reading, from the fifth word line, sixth data of M bits per memory cell on the basis of the $2^{(1+M)}$ second distributions; receiving seventh data of (N−M−1) bits per memory cell from an outside; and setting, for the $2^N$ sections, $2^N$ third distributions corresponding to eighth data of N bits per memory cell including the fifth data, the sixth data, and the seventh data.

The semiconductor memory device and method according to the embodiment will be described below in detail with reference to the accompanying drawings. The present invention is not limited to the embodiment.

EMBODIMENT

As another example of the multi-stage program operation, a multi-stage program operation to be compared with the present embodiment will be described. The multi-stage program operation of another example is referred to as a comparative example. In the comparative example, the memory cell functions as a buffer memory.

Specifically, according to the comparative example, in the first-stage program operation, data of some bits of the data of plural bits finally stored in the memory cell is programmed. In the second-stage program operation subsequent to the first-stage program operation, the previously programmed data of some bits described above is read from the memory cells, and data of all bits obtained by combining the read data of some bits and the data of the remaining bits received from the memory controller is programmed.

In the comparative example, the memory cell to be subjected to the program operation in each stage is selected by, for example, a method similar to the foggy-fine program operation. In other words, the first-stage program operation is performed on the first memory cell and the second memory cell adjacent to the first memory cell, and then the second-stage program operation is performed on the first memory cell.

According to the comparative example, the memory controller holds the data of the remaining bits except for data of some bits for which the first-stage program operation is completed in the buffer memory until the first-stage program operation is completed. Therefore, as compared with the foggy-fine program operation described above, the capacity of the buffer memory of the memory controller can be reduced.

However, in the comparative example, it is required that the data stored in the memory cell in the first-stage program operation can be read without an error in the second-stage program operation. This is because a function of correcting an error included in the read data is generally provided in the memory controller, and thus the error cannot be corrected in the semiconductor memory device. Therefore, according to the comparative example, unlike the case of the foggy-fine program operation, the number of bits of data stored in the first-stage program operation cannot be increased. According to the comparative example, since the number of bits of data to be programmed per memory cell cannot be increased in the first-stage program operation, when the number of bits of data to be finally stored per memory cell is large, the shift amount of the threshold voltage of each memory cell must be increased in the second-stage program operation. Therefore, inter-cell interference in the second-stage program operation is large, and data reliability is impaired.

In the embodiment, a semiconductor memory device and a method will be described which enable the capacity of a buffer memory of a memory controller to be reduced without sacrificing data reliability.

FIG. 1 is a schematic diagram illustrating a configuration example of a semiconductor memory device 1 according to the embodiment. The semiconductor memory device 1 is a memory chip of a NAND flash memory capable of storing data in a nonvolatile manner. The semiconductor memory device 1 can be controlled by an external memory controller 2. The memory controller 2 includes a buffer memory 3, and can hold necessary data in the buffer memory 3.

As illustrated in FIG. 1, the semiconductor memory device 1 includes, for example, a memory cell array 10, a command register 11, an address register 12, a sequencer 13, a driver module 14, a row decoder module 15, and a sense amplifier module 16. The sequencer 13, the driver module 14, the row decoder module 15, and the sense amplifier module 16 are examples of a circuit according to the embodiment.

The memory cell array 10 includes a plurality of blocks BLK0 to BLKn (n is an integer greater than or equal to 1). The block BLK is a set of memory cells capable of storing data in a nonvolatile manner, and is used in a unit of erasure of data, for example. The memory cell array 10 is provided with a plurality of bit lines and a plurality of word lines. Each memory cell is associated with, for example, one bit line and one word line. A detailed configuration of the memory cell array 10 will be described later.

The command register 11 holds a command CMD received by the semiconductor memory device 1 from the memory controller 2. The command CMD includes, for example, an instruction for causing the sequencer 13 to perform a read operation, a program operation, an erase operation, or other operations.

The address register 12 holds address information ADD received by the semiconductor memory device 1 from the memory controller 2. The address information ADD includes, for example, a block address BAd, a page address PAd, and a column address CAd. For example, the block address BAd, the page address PAd, and the column address CAd are used to select the block BLK, the word line, and the bit line, respectively.

The sequencer 13 controls the operation of the entire semiconductor memory device 1. For example, the sequencer 13 performs a read operation, a program operation, an erase operation, and other operations by controlling the driver module 14, the row decoder module 15, the sense amplifier module 16, and others on the basis of the command CMD held in the command register 11.

The driver module 14 generates a voltage used in a read operation, a program operation, an erase operation, and other operations. The driver module 14 applies the generated voltage to the signal line corresponding to the selected word line on the basis of, for example, the page address PAd held in the address register 12.

The row decoder module 15 selects one block BLK in the memory cell array 10 on the basis of the block address BAd held in the address register 12. The row decoder module 15 transfers, for example, the voltage applied to the signal line corresponding to the selected word line to the selected word line in the selected block BLK.

In the program operation, the sense amplifier module 16 applies a desired voltage to each bit line in accordance with the write data DAT received from the memory controller 2. In the read operation, the sense amplifier module 16 determines the data stored in the memory cell on the basis of the voltage of the bit line, and transfers the determination result to the memory controller 2 as read data DAT.

The sense amplifier module 16 includes a data register 17. The data register 17 holds the write data DAT received from the memory controller 2 until storage in the memory cell array 10 is completed, and holds the read data DAT read from the memory cell array 10 until output to the memory controller 2 is completed. The data register 17 temporarily holds some pieces of data read from the memory cell array 10 in the multi-stage program operation according to the embodiment. The details of the multi-stage program operation according to the embodiment will be described later.

The semiconductor memory device 1 and the memory controller 2 described above may be combined to compose a single semiconductor device. Examples of such a single semiconductor device include a memory card such as an SD (trademark) card, and a solid-state drive (SSD).

Figure 2:
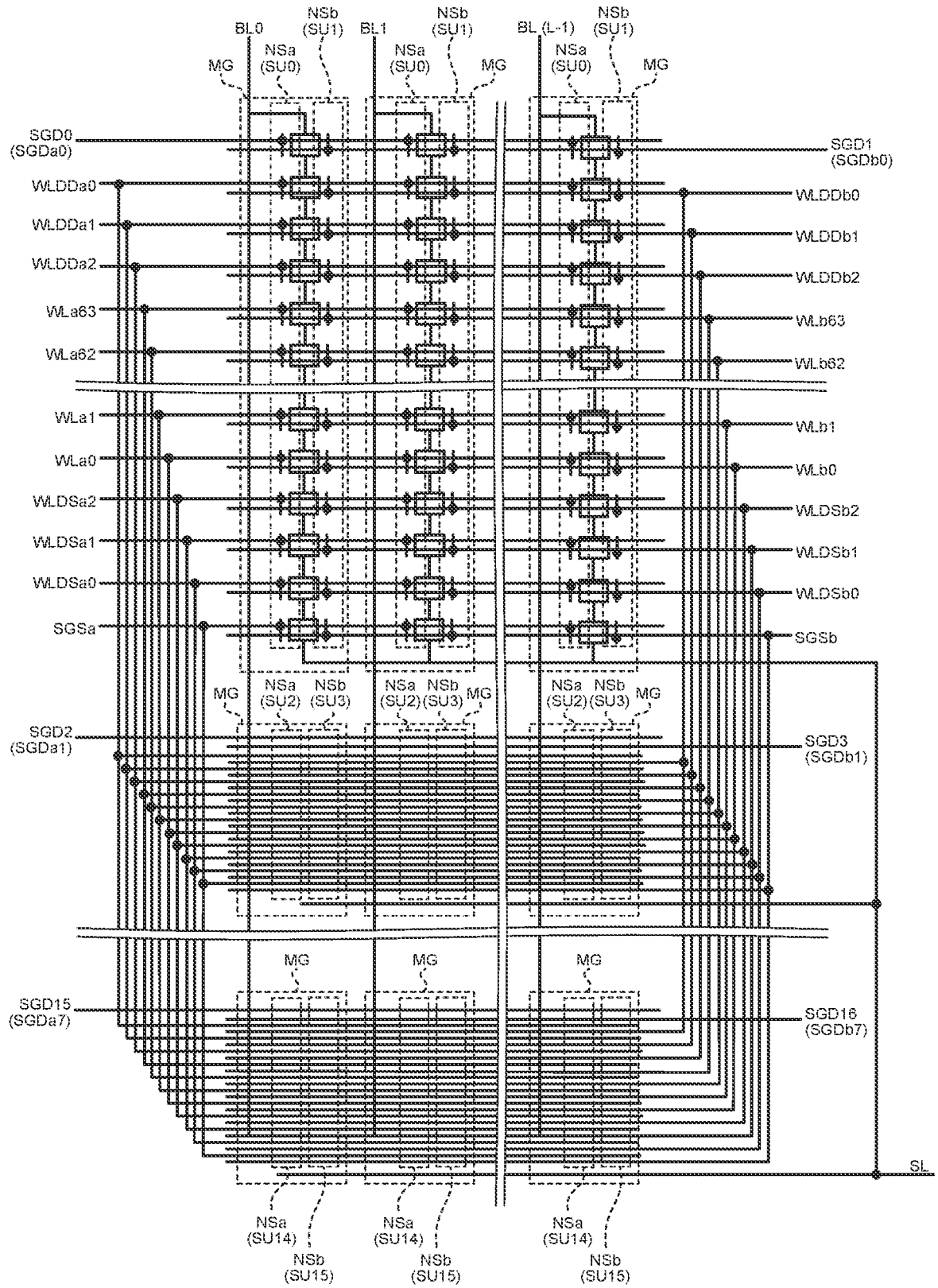
FIG. 2 is a diagram illustrating an example of a circuit configuration of a block BLK according to the embodiment.

FIG. 2 is a diagram illustrating an example of a circuit configuration of the block BLK according to the embodiment. The block BLK includes a plurality of string units SU (16 string units SU0 to SU15 in the example of FIG. 2). A simplified circuit configuration is illustrated in FIG. 2 for part of the two string units SU0 and SU1 included in the block BLK. Each pair of the string unit SU(2p) and the string unit SU(2p+1) included in the block BLK has the same configuration as the pair of the string unit SU0 and the string unit SU1. However, in the example illustrated in FIG. 2, p is an integer between 0 and 7.

Each pair of the string unit SU(2p) and the string unit SU(2p+1) includes a plurality of first memory groups MG. One bit line BL is associated with each of the first memory groups MG. In the example of FIG. 2, the pair of the string unit SU0 and the string unit SU1 includes L (where L is an integer greater than or equal to 1) first memory groups MG. Each of the L first memory groups MG is associated with one of bit lines BL0 to BL(L−1).

Each pair of the string unit SU(2p) and the string unit SU(2p+1) includes L first memory groups MG. Each of the L first memory groups MG included in each pair is associated with one of the bit lines BL0 to BL(L−1).

In other words, in one block BLK, each bit line BL is associated in common with one first memory group MG which is included in each pair of the string unit SU(2p) and the string unit SU(2p+1).

In each pair of the string unit SU(2p) and the string unit SU(2p+1), the L NAND strings NSa of the L first memory groups MG constitute the string unit SU(2p). The L NAND strings NSb of the L first memory groups MG constitute the string unit SU(2p+1).

Figure 3:
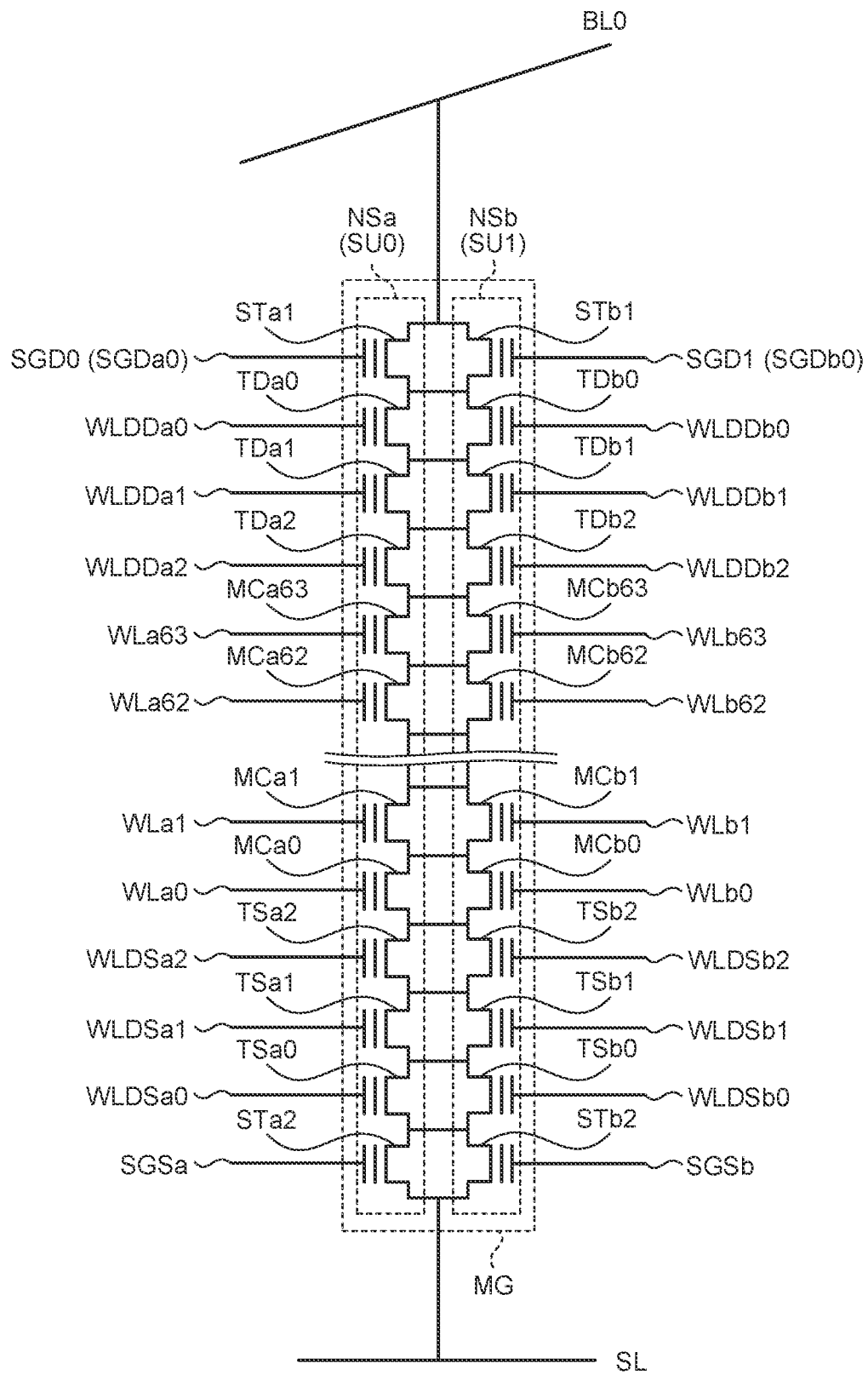
FIG. 3 is a diagram for explaining a more detailed circuit configuration of one first memory group MG according to the embodiment.

FIG. 3 is a diagram for explaining a more detailed circuit configuration of one first memory group MG according to the embodiment. The first memory group MG included in the block BLK has a common configuration. FIG. 3 illustrates a circuit configuration of a first memory group MG associated with a bit line BL0 included in a pair of a string unit SU0 and a string unit SU1 as a representative of the first memory group MG included in the block BLK. Description will be continued with reference to FIGS. 2 and 3. A memory cell transistor MC is hereinafter referred to as a memory cell MC.

The NAND string NSa includes transistors TDa0 to TDa2, transistors TSa0 to TSa2, memory cells MCa0 to MCa63, a selection transistor STa1, and a selection transistor STa2. The number of transistors TDa included in the NAND string NSa is not limited to three. The number of transistors TSa included in the NAND string NSa is not limited to three. The number of memory cells MCa included in the NAND string NSa is not limited to 64.

The NAND string NSb includes transistors TDb0 to TDb2, transistors TSb0 to TSb2, memory cells MCb0 to MCb63, a selection transistor STb1, and a selection transistor STb2. The number of transistors TD included in the NAND string NSb is not limited to three. The number of transistors TS included in the NAND string NSb is not limited to three. The number of memory cells MCb included in the NAND string NSb is not limited to 64.

The string unit SU0 is selected by selection transistors STa1 and STa2 included in each of the L NAND strings NSa constituting the string unit SU0. The string unit SU1 is selected by selection transistors STb1 and STb2 included in each of the L NAND strings NSb constituting the string unit SU1.

Each of the memory cells MCa and MCb includes a control gate and an electric charge storage layer, and holds data in a nonvolatile manner.

In the NAND string NSa, the transistors TSa0 to TSa2, the memory cells MCa0 to MCa63, and the transistors TDa0 to TDa2 are connected in series. A source of the selection transistor STa1 is connected to one ends of the transistors TSa0 to TSa2, the memory cells MCa0 to MCa63, and the transistors TDa0 to TDa2 which are connected in series. The other ends of the transistors TSa0 to TSa2, the memory cells MCa0 to MCa63, and the transistors TDa0 to TDa2 connected in senes are connected to the drain of the selection transistor STa2.

In the NAND string NSb, the transistors TSb0 to TSb2, the memory cells MCb0 to MCb63, and the transistors TDb0 to TDb2 are connected in series. A source of the selection transistor STb1 is connected to one ends of the transistors TSb0 to TSb2, the memory cells MCb0 to MCb63, and the transistors TDb0 to TDb2 which are connected in series. The other ends of the transistors TSa0 to TSa2, the memory cells MCa0 to MCa63, and the transistors TDa0 to TDa2 which are connected in series are connected to the drain of the selection transistor STa2.

The drains of the selection transistors STa1 and STb1 are connected in common to the bit line BL associated with the first memory group MG. The sources of the selection transistors STa2 and STb2 are connected to a source line SL.

For each string unit SU(2p), the gates of the plurality of selection transistors STa1 included in the same block BLK are connected to a common selection gate line SGDa in the string unit SU(2p). For example, all the selection transistors STa1 included in the string unit SU0 are connected in common to a selection gate line SGDa0.

The selection transistors STa2 of each string units SU(2p) included in one block BLK are connected in common to a selection gate line SGSa.

For each string unit SU(2p+1), the gates of the plurality of selection transistors STb1 included in one block BLK are connected to a common selection gate line SGDb in the string unit SU(2p+1). For example, all the selection transistors STb1 included in the string unit SU0 are connected in common to a selection gate line SGDb0.

The selection transistors STb2 of the string units SU(2p+1) included in one block BLK are connected in common to a selection gate line SGSb.

The control gates of the memory cells MCa0 to MCa63 included in one block BLK are connected in common to word lines WLa0 to WLa63, respectively. The control gates of the memory cells MCb0 to MCb63 included in one block BLK are connected in common to word lines WLb0 to WLb63, respectively.

The control gates of the transistors TDa0 to TDa2 included in one block BLK are connected in common to word lines WLDDa0 to WLDDa2, respectively. The control gates of the transistors TDb0 to TDb2 included in one block BLK are connected in common to word lines WLDDb0 to WLDDb2, respectively.

The control gates of the transistors TSa0 to TSa2 included in one block BLK are connected in common to word lines WLDSa0 to WLDSa2, respectively. The control gates of the transistors TSb0 to TSb2 included in one block BLK are connected in common to word lines WLDSb0 to WLDSb2, respectively.

The bit line BL is shared by, for example, the first memory group MG (a pair of the NAND strings NSa and NSb) to which the same column address is allocated. The source line SL is shared by, for example, a plurality of blocks BLK. The selection gate line SGSa is provided for each block BLK. Each of the word lines WLa and WLb, the selection gate lines SGDa and SGDb, and the selection gate lines SGSa and SGSb can be independently controlled.

An example of the structure of the memory cell array 10 provided in the semiconductor memory device 1 according to the embodiment will then be described. In the drawings referred to below, the X direction corresponds to the extending direction of the word line WL, the Y direction corresponds to the extending direction of the bit line BL, and the Z direction corresponds to the vertical direction with respect to a surface of a semiconductor substrate 30 used for forming the semiconductor memory device 1. Hatching is appropriately added to the plan views in order to make the drawings easy to see. The hatching added to the plan views is not necessarily related to the materials or characteristics of the components to which the hatching is added. In the drawings referred to below, in order to avoid complication of the drawings, the numbers of transistors TD and TS and the numbers of memory cells MCa and MCb are depicted to be smaller than those in the examples illustrated in FIGS. 2 and 3.

Figure 4:
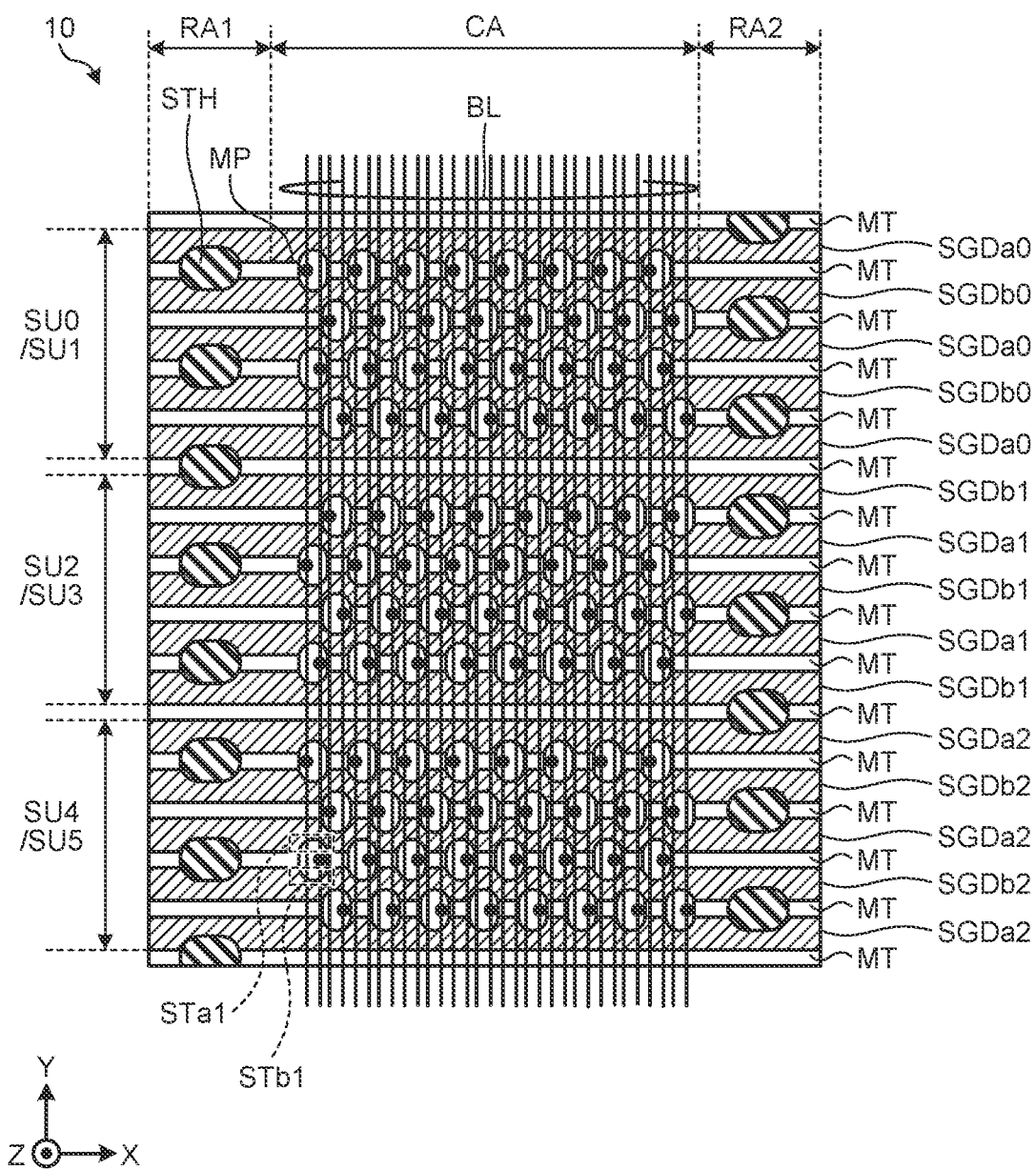
FIG. 4 is a diagram illustrating an example of a planar layout of a memory cell array in the embodiment, with a focus placed on selection gate lines SGDa0 to a2 and SGDb0 to b2.

FIG. 4 is a diagram illustrating an example of a planar layout of the memory cell array 10 in the embodiment, with a focus placed on the selection gate lines SGDa0 to a2 and SGDb0 to b2. In FIG. 4, areas corresponding to six sequentially arranged string units SU0 to SU5 are extracted. As illustrated in FIG. 4, the area of the memory cell array 10 includes a cell area CA and replacement areas RA1 and RA2. The memory cell array 10 includes a plurality of memory trenches MT, a plurality of memory pillars MP, and a plurality of replacement holes STH.

Each of the cell area CA and the replacement areas RA1 and RA2 extends in the Y direction. The cell area CA is sandwiched between the replacement areas RA1 and RA2 in the X direction. Each of the selection gate lines SGDa and SGDb includes a portion extending in the X direction and crosses the cell area CA and the replacement areas RA1 and RA2. The selection gate lines SGDa and SGDb are alternately arranged in the Y direction.

Each memory trench MT is arranged between adjacent selection gate lines SGDa and SGDb. The memory trench MT includes a portion extending in the X direction and separates the wiring layers adjacent to each other in the Y direction. The memory trench MT is embedded with, for example, an insulator.

Each memory pillar MP functions as a first memory group MG and is arranged to overlap with one memory trench MT in the cell area CA. Each memory pillar MP divides the overlapped memory trenches MT and is in contact with each of the selection gate lines SGDa and SGDb adjacent to the divided memory trenches MT. Each part where the memory pillar MP and the selection gate line SGDa are adjacent to each other functions as the selection transistor STa1. Each part where the memory pillar MP and the selection gate line SGDb are adjacent to each other functions as the selection transistor STb1.

At least one bit line BL is provided so as to overlap with each memory pillar MP, and one bit line BL is electrically connected to the memory pillar. In an area corresponding to each block BLK, the plurality of memory pillars MP is arranged in, for example, four rows in a staggered manner. The memory trench MT with which the memory pillar MP is not overlapped is arranged every two string units SU. In other words, the memory cell array 10 divides the even-numbered string units SU or the odd-numbered string units SU by being partitioned by the memory trench MT with which the memory pillar MP is not overlapped.

Each replacement hole STH is used at the time of forming a stacked wiring. For example, the plurality of replacement holes STH includes the replacement holes STH which are arranged to overlap with the even-numbered arranged memory trenches MT in the replacement area RA1, and includes the replacement holes STH which are arranged to overlap with the odd-numbered arranged memory trenches MT in the replacement area RA2. Each of the replacement holes STH divides the overlapped memory trenches MT and is in contact with each of the selection gate lines SGDa and SGDb adjacent to the divided memory trenches MT. The replacement hole STH is embedded with, for example, an insulator.

Figure 5:
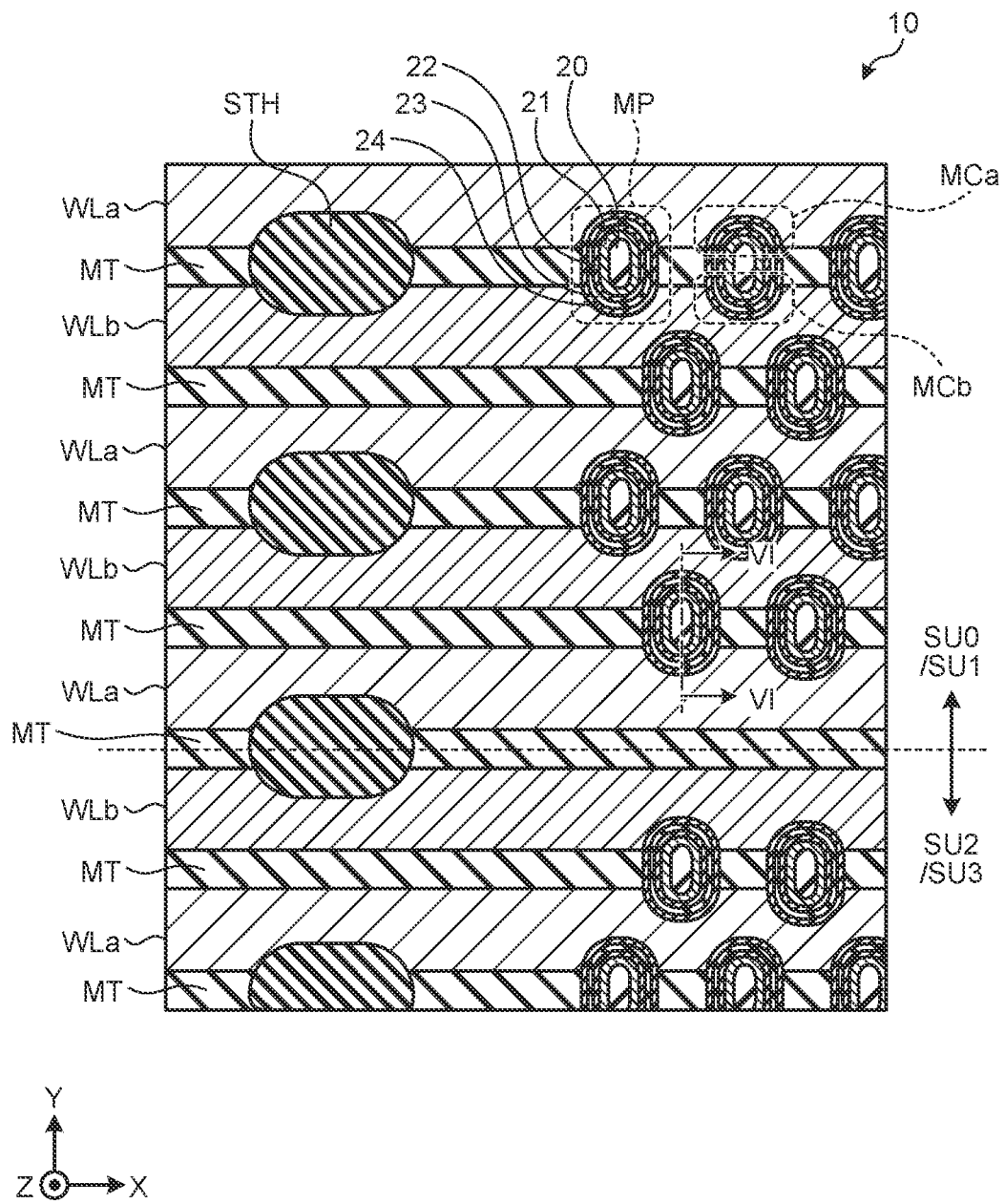
FIG. 5 is a diagram illustrating an example of a planar layout of the memory cell array in the embodiment, with a focus placed on word lines WLa and WLb.

FIG. 5 is a diagram illustrating an example of a planar layout of the memory cell array 10 in the embodiment, with a focus placed on the word lines WLa and WLb. FIG. 5 illustrates an area including the memory trench MT and the replacement hole STH in the boundary portion between the string units SU0/1 and SU2/3. As illustrated in FIG. 5, the memory pillar MP includes a core member 20, a semiconductor layer 21, a tunnel insulating film 22, an insulating film 23, and a block insulating film 24.

Each of the word lines WLa and WLb includes a portion extending in the X direction, and crosses the cell area CA and the replacement areas RA1 and RA2. The word lines WLa and WLb are alternately arranged in the Y direction, and the memory trench MT is arranged between the word lines WLa and WLb. In other words, each of the word lines WLa and WLb includes a portion in contact with each of the memory pillar MP and the replacement hole STH. The portions of the word lines WLa and WLb in contact with the memory pillars MP and the replacement holes STH function as dummy cells.

The ends of the plurality of word lines WLa are electrically connected for each block BLK. The ends of the plurality of WLb are electrically connected for each block BLK.

The core member 20 in the memory pillar MP is provided in a central portion of the memory pillar MP. The semiconductor layer 21 surrounds the periphery of the core member 20. The tunnel insulating film 22 surrounds the periphery of the semiconductor layer 21. The insulating film 23 surrounds the periphery of the tunnel insulating film 22. The block insulating film 24 surrounds the periphery of the insulating film 23. The block insulating film 24 is in contact with each of the adjacent word lines WLa and WLb and the memory trench MT between the adjacent word lines WLa and WLb.

Each part where the memory pillar MP and the word line WLa are adjacent to each other functions as a memory cell MCa. Each part where the memory pillar MP and the word line WLb are adjacent to each other functions as a memory cell MCb. For example, the core member 20 includes an insulator such as silicon oxide ($SiO_2$). The semiconductor layer 21 includes, for example, silicon (Si). Each of the tunnel insulating film 22 and the block insulating film 24 includes, for example, silicon oxide ($SiO_2$). The insulating film 23 includes, for example, silicon nitride (SiN).

Figure 6:
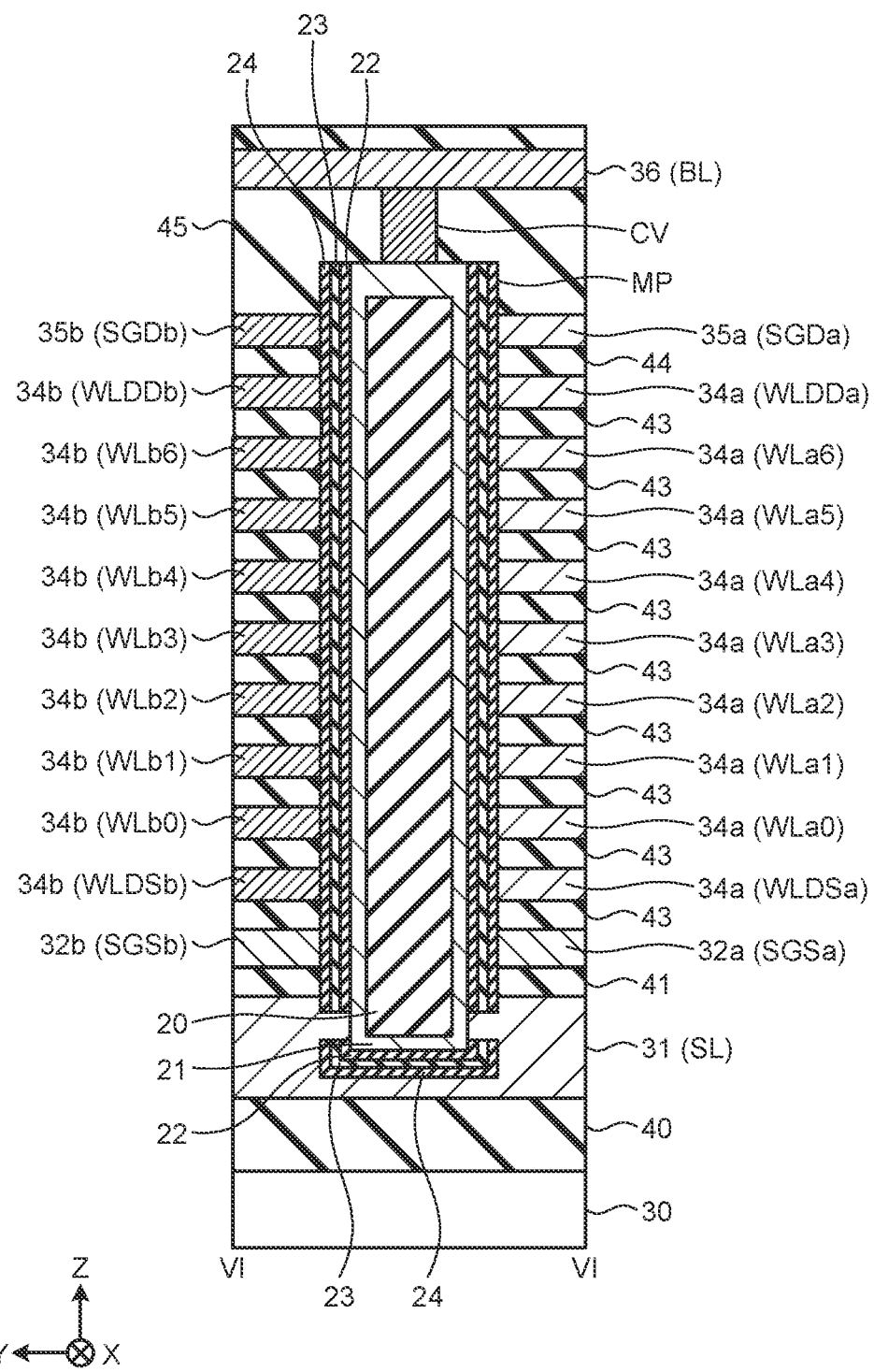
FIG. 6 is a cross-sectional view of the memory cell array in the embodiment taken along line VI-VI of FIG. 5.

FIG. 6 is a cross-sectional view of the memory cell array 10 in the embodiment taken along line VI-VI of FIG. 5. FIG. 6 illustrates an example of a cross-sectional structure of one memory pillar MP. As illustrated in FIG. 6, the memory cell array 10 includes, for example, conductor layers 31, 32a, 32b, 34a, 34b, 35a, 35b, and 36, insulator layers 40, 43, 44, and 45, and a contact CV. A detailed cross-sectional structure of the memory cell array 10 will be described below in order from the lower layer.

The conductor layer 31 is provided on the semiconductor substrate 30 with the insulator layer 40 interposed therebetween. Although not illustrated, a circuit such as the sense amplifier module 16 is provided inside the insulator layer 40. The conductor layer 31 is formed in a plate shape extending in the XY plane, for example, and is used as the source line SL. The conductor layer 31 includes, for example, silicon (Si) doped with phosphorus (P). The conductor layer 31 may include a plurality of types of semiconductor layers, or may include a metal layer.

The conductor layer 32 is provided on the conductor layer 31 with an insulator layer 41 interposed therebetween. The conductor layer 32 is formed in a plate shape extending in the XY plane, for example, and is used as the selection gate line SGS. The conductor layer 32 includes, for example, tungsten (W).

The insulator layers 43 and conductor layers 34 are alternately stacked on the conductor layer 32. The conductor layer 34 is formed, for example, in a plate shape extending in the XY plane. The stacked conductor layers 34 is used as the word lines WLDS, WL0 to WL6, and WLDD, respectively, in order from the semiconductor substrate 30 side. The conductor layer 34 includes, for example, tungsten (W).

The conductor layer 35 is provided on the uppermost conductor layer 34 with the insulator layer 44 interposed therebetween. The conductor layer 35 is formed in a plate shape extending in the XY plane, for example, and is used as the selection gate line SGD. The conductor layer 35 includes, for example, tungsten (W).

The conductor layer 36 is provided on the conductor layer 35 with the insulator layer 45 interposed therebetween. The conductor layer 36 is formed in a line shape extending in the Y direction, for example, and is used as the bit line BL. In other words, the plurality of conductor layers 36 is arranged in the X direction in an area not illustrated. The conductor layer 36 contains, for example, copper (Cu).

The memory pillar MP extends in the Z direction and penetrates the conductor layers 32, 34, and 35 and the insulator layers 41, 43, and 44. The core member 20 in the memory pillar MP extends in the Z direction. The upper end of the core member 20 is included in a layer above the conductor layer 35. The lower end of the core member 20 is included in the layer in which the conductor layer 31 is formed. The semiconductor layer 21 covers the periphery of the core member 20. The tunnel insulating film 22 covers the side surface and the bottom surface of the semiconductor layer 21. The insulating film 23 covers the side surface and the bottom surface of the tunnel insulating film 22. The block insulating film 24 covers the side surface and the bottom surface of the insulating film 23. The conductor layer 31 is in contact with the semiconductor layer 21 with the side surface of the memory pillar MP interposed therebetween.

A columnar contact CV is provided on the semiconductor layer 21 in the memory pillar MP. One conductor layer 36 (bit line BL) is in contact with the contact CV. The memory pillar MP corresponding to the first memory group MG associated with the same column address is connected to the common conductor layer 36 via the contact CV.

The conductor layer 32 is separated into conductor layers 32a and 32b corresponding to the selection gate lines SGSa and SGSb, respectively. The conductor layer 34 is separated into conductor layers 34a and 34b respectively corresponding to the word lines WLDSa and WLDSb, conductor layers 34a and 34b respectively corresponding to the word lines WLa and WLb, and conductor layers 34a and 34b respectively corresponding to the word lines WLDDa and WLDDb. The conductor layer 35 is separated into conductor layers 35a and 35b corresponding to the selection gate lines SGDa and SGDb, respectively.

In the semiconductor memory device 1 according to the embodiment described above, the memory cells MCa and MCb use the insulating film 23 as an electric charge storage layer. The transistors TDa and TDb, the memory cells MCa and MCb, the transistors TSa and TSb, and the selection transistors STa1, STb1, STa2, and STb2 share a channel (the semiconducting layer 21). A set of the selection transistors STa1 and STa2, the transistors TDa and TSa, and the memory cells MCa0 to MCa6 arranged in the Z direction corresponds to the NAND string NSa. A set of the selection transistors STb1 and STb2, the transistors TDb and TSb, and the memory cells MCb0 to MCb6 arranged in the Z direction corresponds to the NAND string NSb.

The memory cells MCa0 to MCa6, the transistors TDa and TSa, and the selection transistors STa1 and STa2 are opposed to the memory cells MCb0 to MCb7, the transistors TDb and TSb, and the selection transistors STb1 and STb2, respectively, in a direction (for example, the Y direction) parallel to the surface of the semiconductor substrate 30.

In the semiconductor memory device 1 according to the embodiment, the threshold voltage of the memory cell MC, in which electric charges are stored in the electric charge storage layer (that is, the insulating film 23), is higher than the threshold voltage of the memory cell MC, in which electric charges are not stored in the electric charge storage layer. By injecting electric charges into the electric charge storage layer of an arbitrary memory cell MC using this phenomenon, data can be stored in the memory cell MC. The operation of storing data in the memory cell MC by injecting electric charges into the memory cell MC is referred to as a program operation.

The data stored in the memory cell MC is determined on the basis of the threshold voltage of this memory cell MC. The operation of determining the data stored in the memory cell MC is referred to as a read operation.

The data stored in the memory cell MC is erased by eliminating the electric charge stored in the electric charge storage layer. The operation of erasing the data stored in the memory cell MC is referred to as an erase operation.

The erase operation is performed in units of blocks BLK. The program operation and the read operation can be collectively performed on a group including a plurality of memory cells MC (L in the example illustrated in FIG. 2) belonging to one string unit SU in the memory cells MC connected to one word line WL. A group including a plurality of memory cells MC as a unit in which the program operation and the read operation can be performed is referred to as a second memory group.

Figure 7:
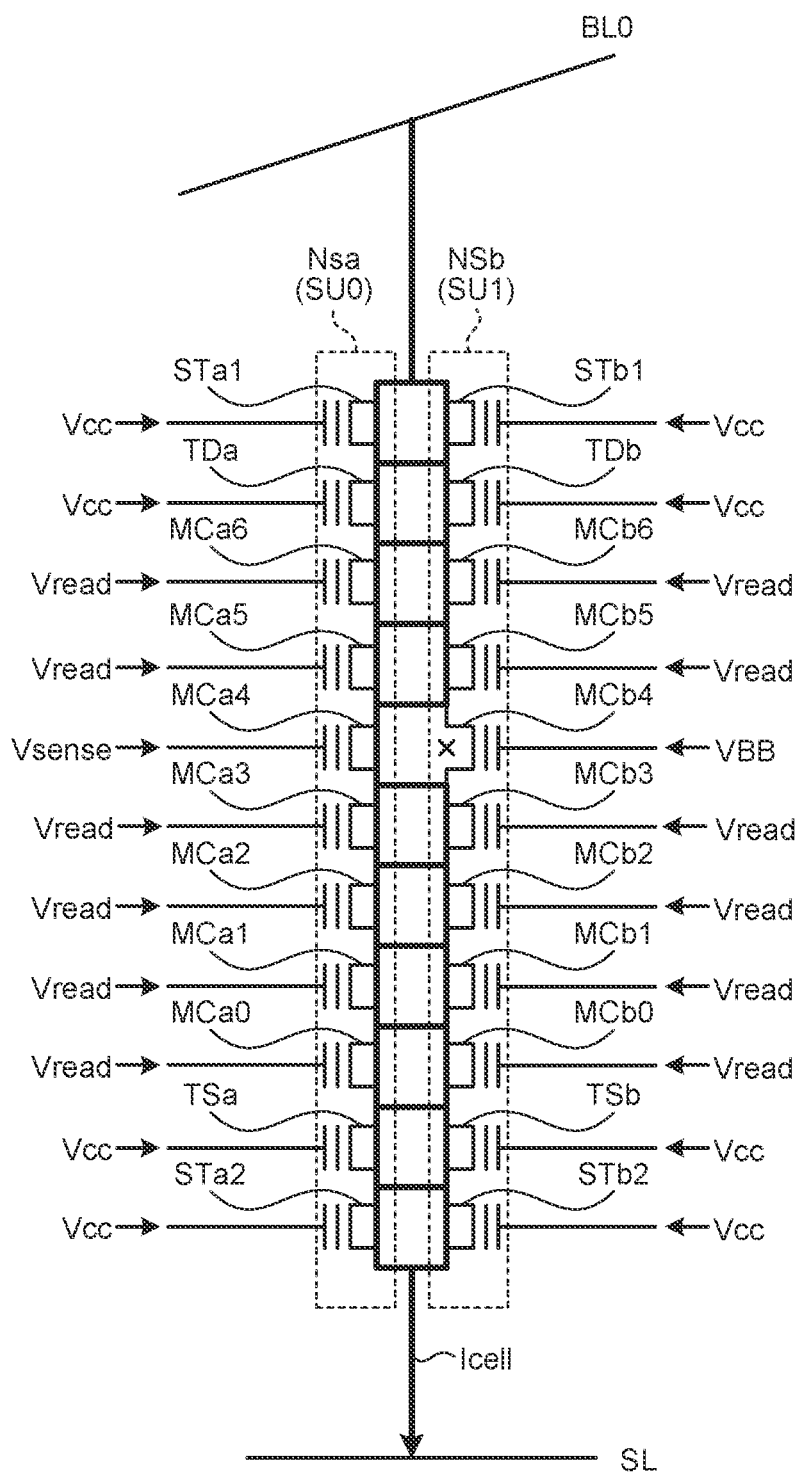
FIG. 7 is a diagram illustrating voltages applied to a plurality of word lines WL connected to one first memory group MG in a read operation according to the embodiment.

A method of operating the first memory group MG in the read operation of the embodiment will be described with reference to FIG. 7. FIG. 7 is a diagram illustrating voltages applied to a plurality of word lines WL connected to one first memory group MG in the read operation according to the embodiment.

In FIG. 7, as an example, the memory cell MCa4 is treated as a read target. The memory cell MCa4 that is the memory cell MC to be read may be referred to as a selection cell MCa4. Another memory cells MCa belonging to the same NAND string NSa as the selection cell MCa4 may be referred to as a non-selection cell. In the memory cells MC belonging to the NAND string NSb sharing the channel (semiconductor layer 21) with the selection cell MCa4 and the non-selection cell, the memory cell MCb4 opposing the selection cell MCa4 may be referred to as an opposing cell MCb4. The other memory cell MCb belonging to the NAND string NSb sharing the channel (semiconductor layer 21) with the selection cell MCa4 and the non-selection cell may be referred to as an obliquely-positioned cell.

During the read operation, the row decoder module 15 applies the read voltage Vread generated by the driver module 14 to the word line WL of the non-selection cell. The read voltage Vread is such a voltage that a portion of the channel opposing the electric charge storage layer is brought into a conductive state regardless of whether or not electric charges are stored in the electric charge storage layer. Thus, the non-selection cell is brought into a conductive state regardless of the programmed data.

The row decoder module 15 applies the back voltage VBB generated by the driver module 14 to the word line WLb4 of the opposing cell MCb4. The back voltage VBB is such a voltage that a portion opposing the electric charge storage layer in the channel is brought into a non-conductive state regardless of whether or not electric charges are stored in the electric charge storage film, and is lower than the read voltage Vread and is, for example, a ground voltage, that is, 0V. Thus, the opposing cell MCb4 is brought into a non-conductive state regardless of whether or not data is programmed and regardless of the programmed data.

The row decoder module 15 applies the read voltage Vread to the word line WL of the obliquely-positioned cell. As a result, these obliquely-positioned cells are brought into a conductive state regardless of whether or not electric charges are stored in the electric charge storage film.

The row decoder module 15 applies the on-voltage Vcc generated by the driver module 14 to the word line SGDa0 of the selection transistor STa1, the word line SGDb0 of the selection transistor STb1, the word line SGSa of the selection transistor STa2, the word line SGSb of the selection transistor STb2, the word line WLDDa of the transistor TDa, the word line WLDDb of the transistor TDb, the word line WLDSa of the transistor TSa, and the word line WLDSb of the transistor TSb. Then, the selection transistors STa1, STb1, STa2, and STb2 and the transistors TDa, TDb, TSa, and TSb are brought into a conductive state.

A bit line voltage Vb1 is applied to the bit line BL. As a result, a current flows through the channel from the bit line BL to the source line SL depending on the conductive state of the selection cell MCa4. This current is referred to as an on-current Icell. The magnitude of the on-current Icell depends on the threshold voltage of the selection cell MCa4.

In this state, the row decoder module 15 applies the detection voltage Vsense generated by the driver module 14 to the word line LLa4 of the selection cell MCa4. The driver module 14 sequentially boosts the detection voltage Vsense, for example, from the vicinity of the ground voltage to the vicinity of the read voltage. In other words, VBB<Vsense<Vread. The sense amplifier module 16 then determines the threshold voltage of the selection cell MC4a by measuring the change in the on-current Icell, thereby reading the programmed data into the selection cell MCa.

In the program operation, the threshold voltage of the memory cell MC is set for a section corresponding to data.

More specifically, the possible range of the threshold voltage of the memory cell MC is divided into $2^N$ sections to which different data of N (where N is an integer greater than or equal to 1) bits are associated. In the program operation, electric charges are injected into the electric charge storage layer of the memory cell MC, thereby setting the threshold voltage of the memory cell MC within a section corresponding to the data in the $2^N$ sections. In the read operation, one or more voltages corresponding to the boundary between adjacent sections as the detection voltage Vsense is sequentially applied, thereby specifying a section including the threshold voltage of the memory cell MC. Data corresponding to the specified section is then acquired as the data stored in the memory cell MC.

Data of one or more bits can be stored in the memory cell MC. A method of storing 1-bit data in the memory cell MC is referred to as a single-level cell (SLC). A method of storing 2-bit data in the memory cell MC is referred to as a multi-level cell (MLC). A method of storing 3-bit data in the memory cell MC is referred to as a triple-level cell (TLC). A method of storing 4-bit data in the memory cell MC is referred to as a quad-level cell (QLC). A method of storing 5-bit data in the memory cell MC is referred to as a penta-level cell (PLC).

Figure 8:
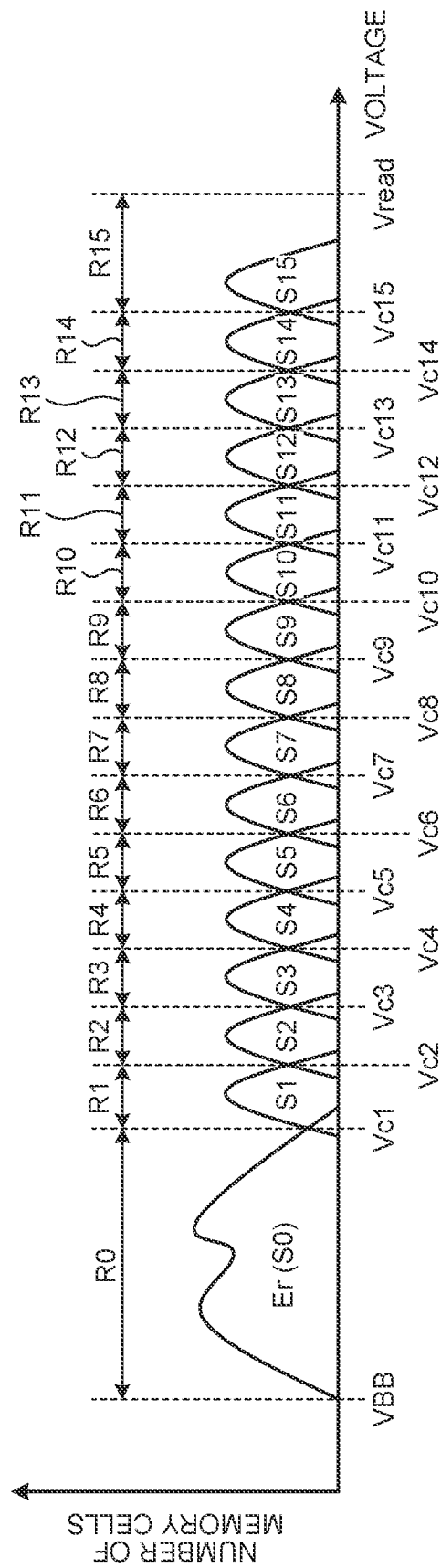
FIG. 8 is a diagram illustrating an example of a plurality of distributions of threshold voltages formed when a program operation is performed by the QLC method in the semiconductor memory device according to the embodiment.

When a program operation is performed on the second memory group, the threshold voltages of the memory cells MC constituting the second memory group form a plurality of distributions. As an example, a plurality of distributions of threshold voltages of a plurality of memory cells MC in each of which data is stored by the QLC method will be described. FIG. 8 is a diagram illustrating an example of a plurality of distributions of threshold voltages formed when a program operation is performed by the QLC method in the semiconductor memory device 1 according to the embodiment. In FIG. 8, the horizontal axis represents voltage, and the vertical axis represents the number of memory cells MC.

In the case of QLC, 16 sections R0 to R15 are provided, each of which is associated with different 4-bit data. For example, a section R0 to a voltage Vc1 is provided on the lowest voltage side. On the higher voltage side than the section R0, provided are a section R1 from the voltage Vc1 to a voltage Vc2, a section R2 from the voltage Vc2 to a voltage Vc3, a section R3 from the voltage Vc3 to a voltage Vc4, a section R4 from the voltage Vc4 to a voltage Vc5, a section R5 from the voltage Vc5 to a voltage Vc6, a section R6 from the voltage Vc6 to a voltage Vc7, a section R7 from the voltage Vc7 to a voltage Vc8, a section R8 from the voltage Vc8 to a voltage Vc9, a section R9 from the voltage Vc9 to a voltage Vc10, a section R10 from the voltage Vc10 to a voltage Vc11, a section R11 from the voltage Vc11 to a voltage Vc12, a section R12 from the voltage Vc12 to a voltage Vc13, a section R13 from the voltage Vc13 to a voltage Vc14, a section R14 from the voltage Vc14 to a voltage Vc15, and a section R15 on the higher voltage side than the voltage Vc15.

The lower limit value of the section R0 which is the section R on the lowest voltage side is higher than at least the back voltage VBB. When the second memory cell MC which is an opposing cell sharing a channel with the first memory cell MC is set as a read target, the back voltage VBB is applied to the control gate of the first memory cell MC. The lower limit value of the section R0 is greater than or equal to the back voltage VBB, so that it is ensured that the first memory cell MC is brought into a non-conductive state when the back voltage VBB is applied to the control gate of the first memory cell MC.

The upper limit value of the section R15 which is the section R on the highest voltage side is at least less than the read voltage Vread. Therefore, each memory cell MC can be brought into a conductive state when the read voltage Vread is applied, regardless of stored data.

In the program operation, the threshold voltage of each memory cell MC is set within a section corresponding to data. As a result, the threshold voltages of the plurality of memory cells MC form a lobe-shaped distribution in each section. The state of the threshold voltage set with a section RX as a target is referred to as a state SX. The distribution of the threshold voltages set with the section RX as a target is referred to as a distribution SX. In the example illustrated in FIG. 8, X is an integer between 0 and 15.

In the erase operation, the threshold voltage of the memory cell MC is set to a state lower than the voltage Vc1. In other words, state S0 can also be regarded as a data-erased state. Therefore, state S0 can also be referred to as a state Er. The distribution S0 can also be referred to as a distribution Er.

In the read operation, the voltage corresponding to the boundary between the adjacent sections R is set as the detection voltage Vsense, thereby determining which section R the threshold voltage of the memory cell MC is included in. For example, each of the voltages Vc1, Vc2, Vc3, Vc4, Vc5, Vc6. Vc7, Vc8, Vc9, Vc10, Vc11, Vc12, Vc13, Vc14, and Vc15 may be used as the detection voltage Vsense.

The threshold voltage of the memory cell MC may vary due to various factors including inter-cell interference. Therefore, the narrower the width of the section R, the more difficult it is to set or maintain the distribution of the threshold voltage in the section R. As a result, part of the high-voltage side or part of the low-voltage side of the lobe-shaped distribution formed in each section R may enter an adjacent section R. According to the example illustrated in FIG. 8, at the boundaries between the adjacent sections R, the portions of the lobe-shaped distributions enter one another's section, and thereby those portions of the distributions of the adjacent sections R overlap with each other.

When a portion of the lobe-shaped distribution S formed in the target section R enters the adjacent section R, in the read operation, erroneous data is read from the memory cell MC whose threshold voltage is included in the entering portion. The erroneous data is sent to the memory controller 2 and is corrected by the function of correcting the error in the memory controller 2.

As an example, in the semiconductor memory device 1 according to the embodiment, it is hereinafter assumed that each memory cell MC is configured such that data is finally stored by the QLC method by a program operation.

As described above, the program operation may be collectively performed on the plurality of memory cells MC constituting the second memory group. According to the QLC method, 4-bit data is stored in each memory cell MC. Data obtained by collecting bit data of the least significant digit of the 4-bit data for the second memory group is referred to as a lower page. Data obtained by collecting bit data of the second digit from the least significant digit of the 4-bit data for the second memory group is referred to as a middle page. Data obtained by collecting bit data of the third digit from the least significant digit of the 4-bit data for the second memory group is referred to as an upper page. Data obtained by collecting bit data of the most significant digit of the 4-bit data for the second memory group is referred to as a top page.

Figure 9:
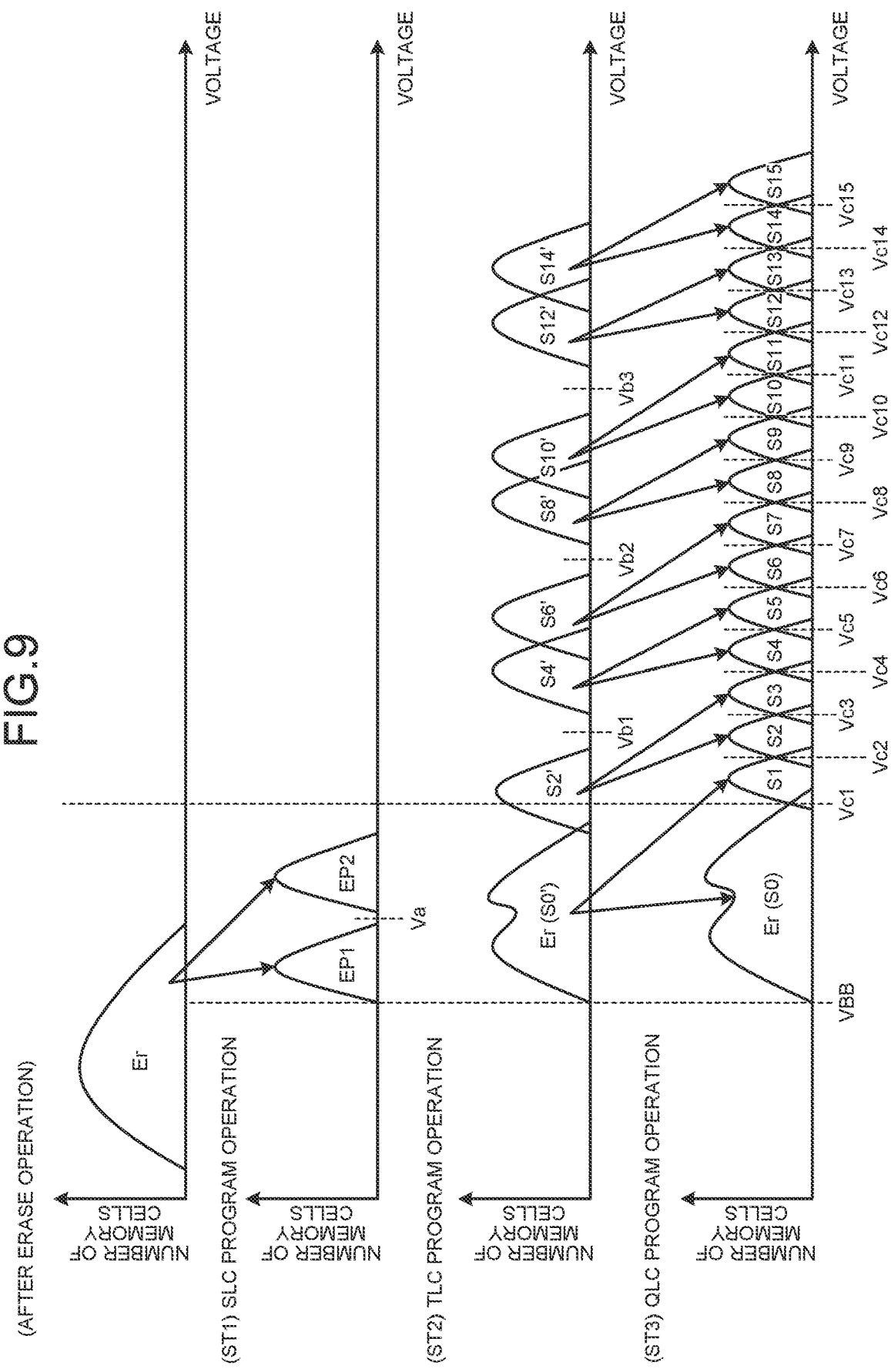
FIG. 9 is a schematic diagram for explaining changes in the distributions of the threshold voltages due to plural-stage program operations constituting a multi-stage program operation according to the embodiment.

In the embodiment, a multi-stage program operation is performed. FIG. 9 is a schematic diagram for explaining changes in the distributions of the threshold voltages due to plural-stage program operation constituting a multi-stage program operation according to the embodiment. FIG. 9 illustrates four graphs depicting changes in the threshold voltage of a group of memory cells MC constituting one second memory group at each stage. In each graph, the horizontal axis represents voltage, and the vertical axis represents the number of memory cells MC.

In the block BLK after the erase operation, all the memory cells MC are in the state Er. In particular, when the program operation is not yet started after the erase operation, as depicted in the uppermost graph of FIG. 9, the threshold voltage of the memory cell MC forms a distribution having a large lobe shape in a range lower than the voltage Vc1. This distribution extends beyond the voltage VBB to the low voltage side.

For the second memory group in the state after the erase operation, 1-bit data is stored in each memory cell MC by the first-stage program operation (also referred to as ST1). In other words, data for one page is stored in the second memory group.

According to the first-stage program operation, as depicted in the second graph from the top in FIG. 9, distributions EP1 and EP2 are formed in the section R0. The distribution EP1 and the distribution EP2 correspond to different 1-bit data. The distribution EP1 and the distribution EP2 are separated from each other across a predetermined voltage Va. The distribution EP1 on the low voltage side out of the distribution EP1 and the distribution EP2 does not cross the voltage Va toward the high voltage side, and the distribution EP2 on the high voltage side out of the distribution EP1 and the distribution EP2 does not cross the voltage Va toward the low voltage side.

Therefore, if the read operation using the voltage Va as the detection voltage Vsense is performed on the memory cell MC in which the first-stage program operation is completed, the semiconductor memory device 1 can acquire 1-bit data including no error from the memory cell MC.

In this specification, the first-stage program operation is also referred to as an SLC program operation in the sense that 1-bit data is stored in each memory cell transistor.

Then, 2-bit data is additionally stored in each memory cell MC by the second-stage program operation (also referred to as ST2). In other words, data for two pages is additionally stored in the second memory group by the second-stage program operation, and the second memory group is in a state in which data for three pages is stored in total.

According to the second-stage program operation, as depicted in the third graph from the top in FIG. 9, a distribution ER (also referred to as distribution S0') and a distribution S2' are formed from the low voltage side in a section higher than the voltage VBB and up to a voltage Vb1, a distribution S4' and a distribution S6' are formed from the low voltage side in a section from the voltage VB1 to a voltage VB2, a distribution S8' and a distribution S10' are formed from the low voltage side in a section from the voltage VB2 to a voltage VB3, and a distribution S12' and a distribution S14' are formed from the low voltage side in a section on the high voltage side of the voltage VB3.

The distribution S0' and the distribution S2' may partially overlap with each other. The distribution S4' and the distribution S6' may partially overlap with each other. The distribution S8' and the distribution S10' may partially overlap with each other. The distribution S12' and the distribution S14' may partially overlap with each other.

However, the distribution S0' and the distribution S2' do not cross the voltage Vb1 toward the high voltage side. The distribution S4' and the distribution S6' do not cross the voltage Vb1 toward the low voltage side. The distribution S4' and the distribution S6' do not cross the voltage Vb2 toward the high voltage side. The distribution S8' and the distribution S10' do not cross the voltage Vb2 toward the low voltage side. The distribution S8' and the distribution S10' do not cross the voltage Vb3 toward the high voltage side. The distribution S12' and the distribution S14' do not cross the voltage Vb3 toward the low voltage side. In other words, according to the second-stage program operation, the groups of the threshold voltages of the memory cells MC constituting the second memory group are set to form eight distributions separated by two groups.

Therefore, by performing the read operation using the voltages Vb1, Vb2, and Vb2 as the detection voltage Vsense on the memory cell MC whose second-stage program operation is completed, the semiconductor memory device 1 can acquire 2-bit data including no error from the memory cell MC.

Note that data coding is defined such that the distribution S0' and the distribution S2' allowed to overlap with each other can be separated by 1-bit data pre-stored by an SLC program operation. Data coding is defined such that the distribution S4' and the distribution S6' allowed to overlap with each other can be separated by 1-bit data pre-stored by the SLC program operation. Data coding is defined such that the distribution S8' and the distribution S10' allowed to overlap with each other can be separated by 1-bit data pre-stored by the SLC program operation. Data coding is defined such that the distribution S12' and the distribution S14' allowed to overlap with each other can be separated by 1-bit data pre-stored by the SLC program operation. Data coding will be described later.

In this specification, the second-stage program operation is also referred to as a TLC program operation in the sense that 3-bit data is stored in each memory cell transistor.

Then, 1-bit data is additionally stored in each memory cell MC by the third-stage program operation (also referred to as ST3). In other words, data for one page is additionally stored in the second memory group by the third-stage program operation, and the second memory group is in a state in which data for four pages in total is stored.

In the third-stage program operation, the threshold voltage of the memory cells MC included in the distribution S0' is maintained or slightly boosted, thereby dividing the distribution S0' into a distribution S0 and a distribution S1. The threshold voltage of the memory cell MC included in the distribution S2' is slightly boosted, thereby dividing the distribution S2' into a distribution S2 and a distribution S3. The threshold voltage of the memory cell MC included in the distribution S4' is slightly boosted, thereby dividing the distribution S4' into a distribution S4 and a distribution S5. The threshold voltage of the memory cell MC included in the distribution S6' is slightly boosted, thereby dividing the distribution S6' into a distribution S6 and a distribution S7. The threshold voltage of the memory cell MC included in the distribution S8' is slightly boosted, thereby dividing the distribution S8' into a distribution S8 and a distribution S9. The threshold voltage of the memory cell MC included in the distribution S11' is slightly boosted, thereby dividing the distribution S11' into a distribution S10 and a distribution S11. The threshold voltage of the memory cell MC included in the distribution S12' is slightly boosted, thereby dividing the distribution S12' into a distribution S12 and a distribution S13. The threshold voltage of the memory cell MC included in the distribution S14' is slightly boosted, thereby dividing the distribution S14' into a distribution S14 and a distribution S15.

As described above, in the multi-stage program operation according to the embodiment, the three-stage program operation is performed.

The 1-bit data stored in each memory cell MC by the first-stage program operation is read before the program operations of the second-stage and the third-stage, and is used in the program operations of the second-stage and the third-stage. The 2-bit data additionally stored in each memory cell MC by the second-stage program operation is read before the third-stage program operation, and is used in the third-stage program operation.

In other words, according to the embodiment, the 1-bit data stored in the memory cell MC by the first-stage program operation and the 2-bit data stored in the memory cell MC by the second-stage program operation can be read. Therefore, the memory controller 2 does not need to hold the 1-bit data stored in the memory cell MC by the first-stage program operation and the 2-bit data stored in the memory cell MC by the second-stage program operation in the buffer memory 3 until the storage of data of all bits is completed. In other words, the amount of data to be held in the buffer memory 3 of the memory controller 2 can be significantly reduced as compared with the configuration in which the foggy-fine program operation is performed.

According to the embodiment, since data of as many bits as possible (3-bit data in the example illustrated in FIG. 9) is stored in the program operation of one stage before the last stage, that is, the second-stage program operation, the threshold voltage of each memory cell MC can be set close to the target section R by the second-stage program operation. As a result, the shift amount of the threshold voltage in the program operation of the last stage, that is, the third-stage program operation, is suppressed, so that a decrease in data reliability due to inter-cell interference can be suppressed.

In other words, according to the embodiment, the amount of data that needs to be held in the memory controller 2 can be reduced without impairing data reliability.

FIG. 10 is a diagram illustrating an example of coding of the embodiment that enables the multi-stage program operation illustrated in FIG. 9. According to the example of coding illustrated in the figure, state S0 is associated with data "111", state S1 is associated with data "1110", state S2 is associated with data "1100", state S3 is associated with data "101", state S4 is associated with data "0101", state S5 is associated with data "0100", state S6 is associated with data "0110", state S7 is associated with data "0111", state S8 is associated with data "0011", state S9 is associated with data "0010", state S10 is associated with data "0000", state S11 is associated with data "0001", state S12 is associated with data "1001", state S13 is associated with data "1000", state S14 is associated with data "1010", and state S15 is associated with data "1011". Note that, when data "abcd" is described, "a" represents a bit belonging to the lower page, "b" represents a bit belonging to the middle page, "c" represents a bit belonging to the upper page, and "d" represents a bit belonging to the top page.

According to the coding illustrated in FIG. 10, the upper page data is stored in the first-stage program operation. In the second-stage program operation, the lower page data and the middle page data are additionally stored. In the third-stage program operation, the top page data is additionally stored.

According to the above-described coding, it is possible to separate the distribution S0' (that is, the distribution before being divided into the distribution S0 and the distribution S1) and the distribution S2' (that is, the distribution before being divided into the distribution S2 and the distribution S3), which are formed by the second-stage program operation in which the lower page and the middle page are stored, and which are allowed to overlap with each other, by the bits of the upper page stored by the first-stage program operation. It is possible to separate the distribution S4' (that is, the distribution before being divided into the distribution S4 and the distribution S5) and the distribution S6' (that is, the distribution before being divided into the distribution S6 and the distribution S7) which are allowed to overlap with each other. It is possible to separate the distribution S8' (that is, the distribution before being divided into the distribution S8 and the distribution S9) and the distribution S10' (that is, the distribution before being divided into the distribution S10 and the distribution S11) which are allowed to overlap with each other. It is possible to separate the distribution SIT (that is, the distribution before being divided into the distribution S12 and the distribution S13) and the distribution S14' (that is, the distribution before being divided into the distribution S14 and the distribution S15) which are allowed to overlap with each other.

As described above, the coding is defined such that the bits stored in the first-stage program operation can separate the two distributions allowed to overlap with each other formed by the second-stage program operation. The coding can be arbitrarily defined as long as the bits stored in the first-stage program operation can separate the two distributions allowed to overlap with each other formed by the second-stage program operation.

Next, an example of the details of the multi-stage program operation performed in the semiconductor memory device 1 according to the embodiment will then be described with reference to FIGS. 11 to 15. An operation of storing data in one block BLK will be described below.

Figure 11:
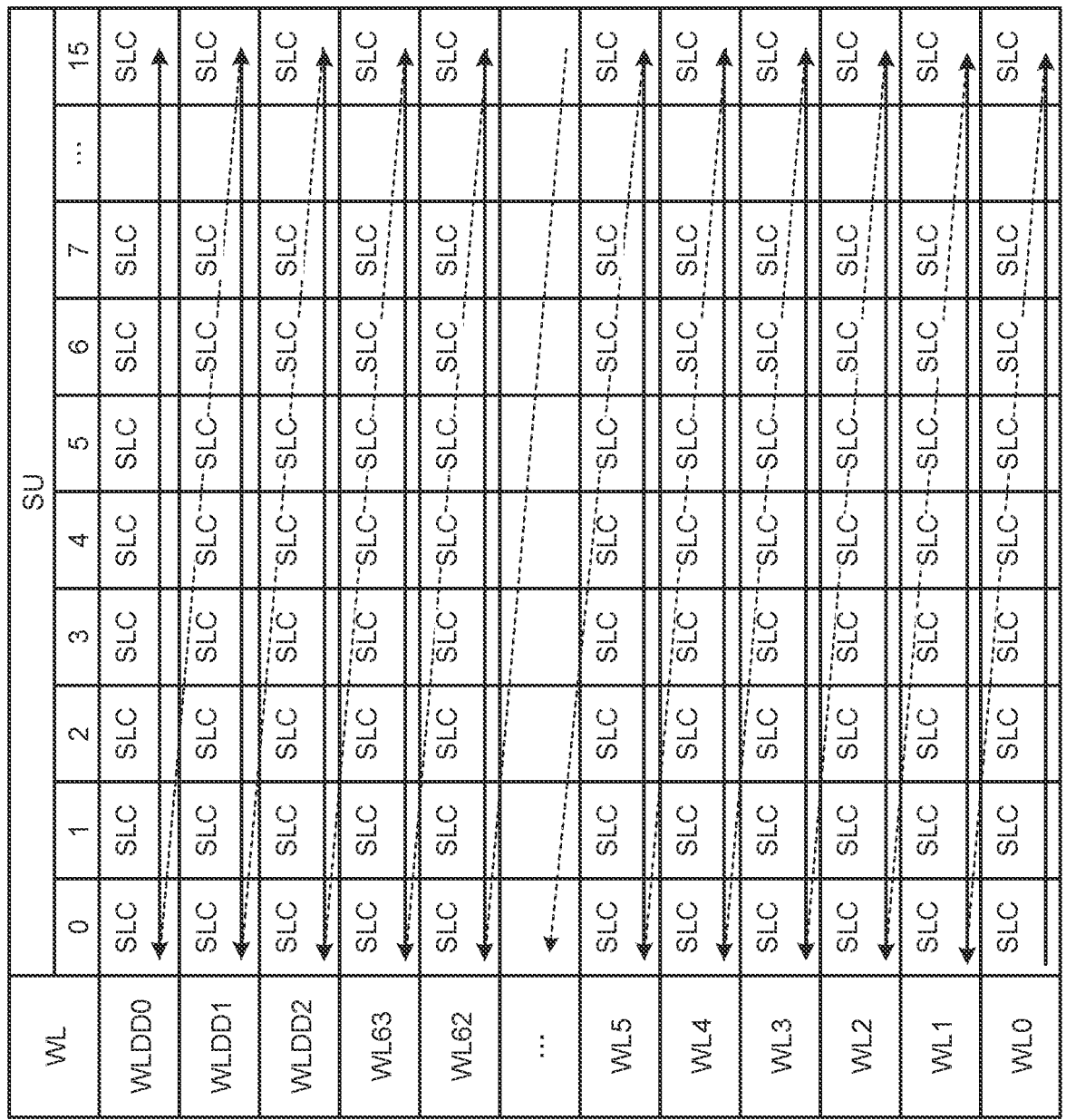
FIG. 11 is a diagram for explaining an example of the order of execution of the first-stage program operation by the semiconductor memory device according to the embodiment.

FIG. 11 is a diagram for explaining an example of the order of execution of the first-stage program operation by the semiconductor memory device 1 according to the embodiment. The arrows illustrated in FIG. 11 indicate the order of executing the first-stage program operation, that is, the SLC program operation. The contents illustrated in FIG. 11 conform to the configuration example of FIG. 2.

The semiconductor memory device 1 performs the SLC program operation of storing the upper page data on all the second memory groups provided in the block BLK after the erase operation on example, as illustrated in FIG. 11, the word lines WL connected to the second memory group are selected in order of the word line numbers from the source line SL side. The SLC program operation is performed on the second memory group of each string unit SU connected to the selected word line WL in order of the string unit SU number. In the SLC program operation on the string unit SU(2p), the word line WLa is used, and in the SLC program operation on the string unit SU(2p+1), the word line WLb is used.

After all the word lines WL are selected, the three word lines WLDD are sequentially selected, and during the selection of each word line WLDD, the SLC program operation is performed for each group of dummy cells of each string unit SU connected to the selected word line WL.

As with the memory cell MC, the dummy cell is configured such that the threshold voltage can be set by the SLC program operation as depicted in the second graph from the top in FIG. 9.

The semiconductor memory device 1 stores the upper page data for one word line WL in each dummy cell group for at least three word lines WLDD.

Figure 12:
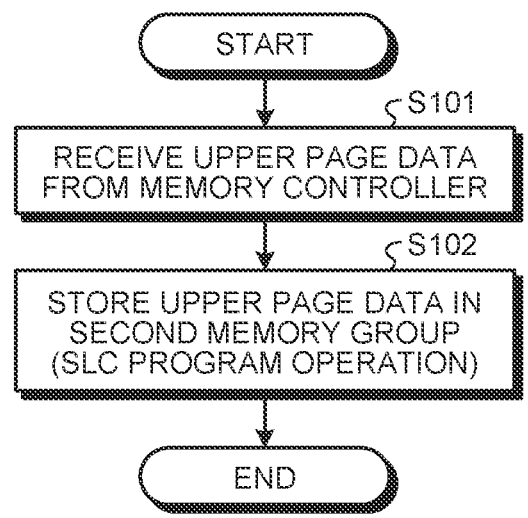
FIG. 12 is a flowchart illustrating an example of a series of processes related to an SLC program operation on one second memory group performed by the semiconductor memory device according to the embodiment.

FIG. 12 is a flowchart illustrating an example of a series of processes related to the SLC program operation on one second memory group performed by the semiconductor memory device 1 according to the embodiment. The series of processes illustrated in FIG. 12 is similarly performed on the dummy cell group. The series of processes illustrated in FIG. 12 is an example of a first operation. The series of processes illustrated in FIG. 12 is performed by cooperation of the sequencer 13, the driver module 14, the row decoder module 15, and the sense amplifier module 16 which are circuits according to the embodiment.

First, the semiconductor memory device 1 receives the upper page data from the memory controller 2 (STEP 101). The semiconductor memory device 1 then stores the received upper page data in the second memory group, which is connected to the word line WL selected in the order illustrated in FIG. 11 and belongs to the string unit SU selected in the order illustrated in FIG. 11 by the SLC program operation (STEP 102). The series of processes related to the SLC program operation on one second memory group is then ended.

In the SLC program operation, the upper data whose final storage destination is connected to a word line WLi and which is the second memory group belonging to a string unit SUj is stored in the second memory group which is connected to the word line WL(i+3) and belongs to the string unit SUj in the first-stage program operation. In the example illustrated in FIG. 12, i is an integer between 0 and 63, and j is an integer between 0 and 15.

As described above, the upper data is stored in the word line WL separated from the final storage destination by three on the bit line BL side for the reason that the upper page data stored in the word lines WL(i+1) and WL(i+2) cannot be read without error due to inter-cell interference when the second-stage program operation and the third-stage program operation are performed on each second memory group connected to the word line WLi.

In the first-stage program operation, the upper data in which the second memory group connected to the word line WL61 and belonging to the string unit SUj is the final storage destination is stored in, for example, the dummy cell group connected to the word line WLDD2 and belonging to the string unit SUj. The upper data in which the second memory group connected to the word line WL62 and belonging to the string unit SUj is the final storage destination is stored in, for example, the dummy cell group connected to the word line WLDD1 and belonging to the string unit SUj. The upper data, which is the second memory group connected to the word line WL63 and belonging to the string unit SUj, is stored in, for example, the dummy cell group connected to the word line WLDD0 and belonging to the string unit SUj.

In the first-stage program operation, arbitrary data of one page can be stored in each second memory group connected to each of the word lines WL0 to WL2.

The interval between the word line WL of the final storage destination of the upper data and the word line WL of the storage destination of the upper data in the first-stage program operation is not limited to three word lines W L. The interval between the word line WL of the final storage destination of the upper data and the word line WL of the storage destination of the upper data in the first-stage program operation may be four or more word lines WL. When the interval between the word line WL of the final storage destination of the upper data and the word line WL of the storage destination of the upper data in the first-stage program operation is four or more word lines WL, each block BLK is provided with four or more word lines WLDD to WLDS to which the dummy cell group of each string unit SU is connected, and the first-stage program operation is performed on each dummy cell group connected to the four or more word lines WLDD to WLDS.

FIGS. 13, 14, 15, and 16 are diagrams for explaining an example of the order of execution of the second-stage program operation and the third-stage program operation by the semiconductor memory device 1 according to the embodiment. The arrows illustrated in FIGS. 13, 14, 15, and 16 indicate the order of executing the second-stage program operation, that is, the TLC program operation, and the third-stage program operation, that is, the QLC program operation. The contents illustrated in these figures conform to the configuration example of FIG. 2.

For the block BLK in which the first-stage program operation is completed, first, as illustrated in FIG. 13, the TLC program operation is performed on all the second memory groups connected to the word lines WL0 in numerical order of the string units.

Since the shift amount of the threshold voltage according to the TLC program operation is larger than the shift amount of the threshold voltage in the SLC program operation or the QLC program operation, the data stored by the SLC program operation in the adjacent word line WL cannot be read from the second memory group without error. Therefore, for example, as illustrated in FIG. 13, when the TLC program operation is performed on the five second memory groups connected to the word line WL0 and belonging to the string units SU0 to SU4, the data stored by the SLC program operation in the five second memory groups connected to the word line WL1 and belonging to the string units SU0 to SU4 cannot be read without error.

When the TLC program operation is completed for all the second memory groups connected to the word line WL0, as illustrated in FIG. 14, the TLC program operation is performed on all the second memory groups connected to the word line WL1 in numerical order of the string units.

When the TLC program operation is performed on all the second memory groups connected to the word line WL1, the data stored by the SLC program operation in all the second memory groups connected to the word line WL1 cannot be read without error for the above-described reason.

As illustrated in FIG. 15, the QLC program operation is then performed on all the second memory groups connected to the word line WL0 in numerical order of the string units.

Figure 16:
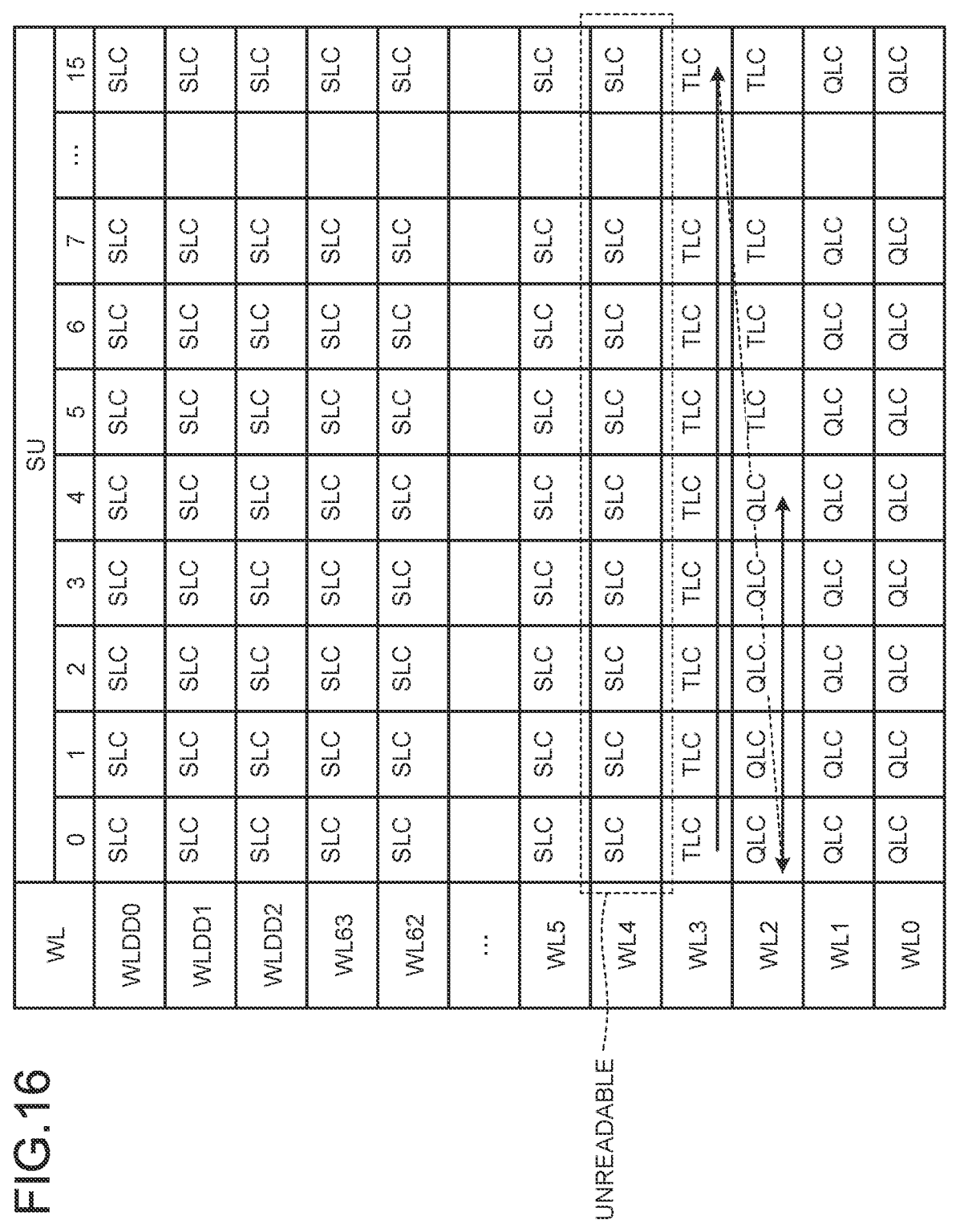

As illustrated in FIG. 16, the TLC program operation is thereafter repeatedly performed on all the second memory groups connected to the word line WL(i+1) in numerical order of the string units, and then the QLC program operation is repeatedly performed on all the second memory groups connected to the word line WLi in numerical order of the string units. Thus, storage of data for four pages is completed for each unit connected to each word line WL.

As described above, the execution order of the second-stage program operation and the third-stage program operation is determined such that the second-stage program operation is performed on all the second memory groups connected to two adjacent word lines WL and then the third-stage program operation is performed on all the second memory groups connected to one word line WL of the two word lines WL.

FIG. 17 is a flowchart illustrating an example of a series of processes related to the TLC program operation on one second memory group performed by the semiconductor memory device 1 according to the embodiment. This figure illustrates a procedure in the case where the TLC program operation is performed on the second memory group connected to the word line WLi. The series of processes illustrated in FIG. 17 is an example of the second operation. The series of processes illustrated in FIG. 17 is performed by cooperation of the sequencer 13, the driver module 14, the row decoder module 15, and the sense amplifier module 16 which are circuits according to the embodiment.

The semiconductor memory device 1 transfers the upper page data pre-stored in the second memory group connected to the word line WL(i+3) from the second memory group to the data register 17 (STEP 201). The semiconductor memory device 1 receives the lower page data and the middle page data from the memory controller 2 (STEP 202). The semiconductor memory device 1 then stores data for three pages including the lower page data and the middle page data received in the process of STEP 201 and the upper page data acquired in the data register 17 in the process of STEP 201 in the second memory group connected to the word line WLi by the TLC program operation (STEP 203). The series of processes related to the TLC program operation on one second memory group is then ended.

In the series of processes illustrated in FIG. 17, the execution order of the process of STEP 201 and the process of STEP 202 is not limited to the order described above. The process of STEP 202 may be performed prior to the process of STEP 201.

FIG. 18 is a flowchart illustrating an example of a series of processes related to the QLC program operation on one second memory group performed by the semiconductor memory device 1 according to the embodiment. In this figure, the series of processes is illustrated assuming that the target on which the QLC program operation is performed is the second memory group connected to the word line WLi. The series of processes illustrated in FIG. 18 is performed by cooperation of the sequencer 13, the driver module 14, the row decoder module 15, and the sense amplifier module 16 which are circuits according to the embodiment.

The semiconductor memory device 1 transfers the upper page data pre-stored in the second memory group connected to the word line WL(i+3) from the second memory group to the data register 17 (STEP 301). The semiconductor memory device 1 further transfers the lower page data and the middle page data pre-stored in the storage destination of the data by the QLC program operation, that is, the second memory group connected to the word line WLi from the second memory group to the data register 17 (STEP 302). The semiconductor memory device 1 receives the top page data from the memory controller 2 (STEP 303).

The semiconductor memory device 1 then stores data for four pages including the lower page data and the middle page data acquired in the data register 17 in the process of STEP 302, the upper page data acquired in the data register 17 in the process of STEP 301, and the top page data received in the process of STEP 303 in the second memory group connected to the word line WLi by the QLC program operation (STEP 304). The series of processes related to the QLC program operation on one second memory group is then ended.

In the series of processes illustrated in FIG. 18, the execution order of the processes of STEP 301 to STEP 303 is not limited to the order described above. The execution order of the processes of STEP 301 to STEP 303 may be arbitrarily changed.

The example in which data is stored in the memory cell MC by the QLC method has been described above. The method of storing data in the memory cell MC is not limited to QLC. For example, the method may also be applied to a PLC method that 5-bit data is stored in the memory cell MC or a method in which 6-bit or more data is stored in the memory cell MC.

FIG. 19 is a diagram illustrating an example of coding that enables a multi-stage program operation according to the embodiment when the PLC method is applied. According to the example of coding illustrated in this figure, state S0 is associated with data "11111", state S1 is associated with data "11110", state S2 is associated with data "11100", state S3 is associated with data "11101", state S4 is associated with data "11001", state S5 is associated with data "111011", state S6 is associated with data "11010", state S7 is associated with data "11000", state S8 is associated with data "01000", state S9 is associated with data "01001", state S10 is associated with data "01011", state S11 is associated with data "01010", state S12 is associated with data "01110", state S13 is associated with data "01100", state S14 is associated with data "01101", state S15 is associated with data "01111", state S16 is associated with data "00111", state S17 is associated with data "00110", state S18 is associated with data "00100", state S19 is associated with data "00101", state S20 is associated with data "00001", state S21 is associated with data "00011", state S22 is associated with data "00010", state S23 is associated with data "00000", state S24 is associated with data "10000", state S25 is associated with data "10001", state S26 is associated with data "10011", state S27 is associated with data "10010", state S28 is associated with data "10110", state S29 is associated with data "10100", state S30 is associated with data "10101", and state S31 is associated with data "10111". Note that, when data "abcde" is described, "a" represents a bit belonging to the base page, "b" represents a bit belonging to the lower page, "c" represents a bit belonging to the middle page, "d" represents a bit belonging to the upper page, and "e" represents a bit belonging to the top page.

According to the coding illustrated in FIG. 19, the middle page data is stored in the first-stage program operation. In the second-stage program operation, the base page data and the lower page data are additionally stored. In the third-stage program operation, the upper page data and the top page data are additionally stored.

In the example described above, in the second-stage program operation, data of two pages is additionally stored per memory cell MC. The number of bits of data stored in the second-stage program operation may be two or more. In other words, when the number of bits of data finally stored in the memory cell MC is N and the number of bits of data additionally stored in the memory cell MC in the second-stage program operation is M, N and M may be arbitrarily set if N is an integer greater than or equal to 4, M is an integer greater than or equal to 2, and 1+M<N is satisfied.

As described above, the sequencer 13, the driver module 14, the row decoder module 15, and the sense amplifier module 16 which are the circuits according to the embodiment perform the first operation on a plurality of memory cell groups (that is, a plurality of second memory groups) (see, for example. FIG. 11). The first operation includes: receiving first data of 1 bit per memory cell from the outside (see, for example, STEP 101 in FIG. 12); and setting the threshold voltages of the plurality of memory cells so as to form two separated first distributions (see, for example, the second graph from the top in FIG. 9) corresponding to the first data in a first section on the lowest voltage side in the $2^N$ sections (see, for example, STEP 102 in FIG. 12). After the first operation on the plurality of memory cell groups, the circuit performs the second operation on the memory cell groups connected to two adjacent second word lines in the plurality of first word lines (see, for example, FIGS. 13 and 14). The second operation includes: reading second data of 1 bit per memory cell, on the basis of two first distributions, from a memory cell group connected to a fourth word line which is a first word line three or more away from a third word line which is one of two second word lines in the plurality of first word lines (see, for example, STEP 201 in FIG. 17); receiving third data of M bits per memory cell from an outside (see, for example, STEP 202 in FIG. 17); and setting threshold voltages of a plurality of memory cells included in a memory cell group connected to the third word line such that $2^{(1+M)}$ second distributions (see, for example, the third graph from the top in FIG. 9) corresponding to fourth data of (1+M) bits are separately formed two by two per memory cell including the second data and the third data (see, for example, STEP 203 in FIG. 17). Further, after the second operation on a memory cell group connected to each of the two second word lines, the circuit performs the third operation on the memory cell group connected to a fifth word line which is one of the two second word lines (see, for example, FIGS. 15 and 16). The third operation includes: reading fifth data of 1 bit per memory cell, on the basis of two first distributions, from a sixth word line which is a first word line three or more away from a fifth word line in the plurality of first word lines (see, for example, STEP 301 in FIG. 18); reading sixth data of M bits per memory cell, on the basis of $2^{(1+M)}$ second distributions, from a fifth word line (see, for example, STEP 302 in FIG. 18); receiving seventh data of (N−M−1) bits per memory cell from an outside (see, for example, STEP 303 of FIG. 18); and setting $2^N$ third distributions corresponding to eighth data of N bits per memory cell including the fifth data, the sixth data, and the seventh data in $2^N$ sections (see, for example, STEP 304 in FIG. 18).

The memory controller 2 does not need to hold the 1-bit data stored in the memory cell MC by the first-stage program operation and the M-bit data stored in the memory cell MC by the second-stage program operation, in the buffer memory 3, until the storage of data of all bits is completed. Therefore, the amount of data to be held in the buffer memory 3 of the memory controller 2 can be significantly reduced as compared with the configuration in which the foggy-fine program operation is performed.

Since data of as many bits as possible is stored in the program operation of one stage before the last stage, that is, the second-stage program operation, the threshold voltage of each memory cell MC can be set close to the target section R by the second-stage program operation. As a result, since the shift amount of the threshold voltage in the program operation of the last stage, that is, the third-stage program operation is suppressed, a decrease in data reliability due to inter-cell interference can be suppressed.

In other words, according to the embodiment, the amount of data that needs to be held in the memory controller 2 can be reduced without impairing data reliability.

According to the embodiment, the block BLK includes at least three dummy seventh word lines (for example, word lines WLDD) and a plurality of dummy memory cell groups (that is, dummy cell groups) connected to each of the at least three dummy seventh word lines. The circuit performs the first operation on each of the dummy memory cell groups connected to each of the at least three dummy seventh word lines (see, for example, FIG. 11).

As described above, the circuit stores data by the first-stage program operation at a position separated by three or more word lines WL from the word line to which the second memory group of the final storage destination is connected. Therefore, when data for all the second memory groups included in one block BLK is to be stored in the block BLK by the first-stage program operation, a redundant storage area for three or more word lines WL is required. In the embodiment, the block BLK includes three or more redundant word lines WLDD and dummy cell groups connected to each word line WLDD. Therefore, the block BLK can store the data for all the second memory groups stored by the first-stage program operation in the block BLK.

According to the embodiment, the circuit starts the second operation after the first operation is performed on all the second memory groups and all the dummy memory groups connected to the word line WLDD, for example, as illustrated in FIG. 11.

When the first operation is performed on the second memory group connected to each of at least four word lines WL arranged in a partially continuous manner, the circuit can perform the first operation on the second memory group connected to one of the four word lines WL.

According to the embodiment, the plurality of second memory groups includes one memory cell MC (referred to as a first memory cell MC) and a second memory cell MC which belongs to a second memory group different from the first memory cell MC and shares a channel with the first memory cell MC. The first memory cell MC and the second memory cell MC belong to the same first memory group MG and are opposed to each other. The circuit includes a word line WL to which the second memory cell MC is connected when reading is performed on the first memory cell MC, and a voltage VBB is applied to the word line. The lower limit value of the section R0 on the lowest voltage side of the $2^N$ sections is smaller than the voltage VBB.

When reading is performed on the first memory cell MC, the voltage VBB is applied to the gate electrode of the second memory cell MC to bring the second memory cell MC into a non-conductive state, such that a cell current Icell corresponding to the threshold voltage of the first memory cell MC flows from the bit line BL toward the source line SL. Therefore, the data stored in the first memory cell MC can be read appropriately.

While some embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
    a plurality of memory cell groups, each memory cell being configured to store data of N bits corresponding to $2^N$ sections in which a threshold voltage is set;
    a plurality of first word lines, each first word line being connected to any one of the plurality of memory cell groups; and
    a circuit configured to
        perform a first operation on the plurality of memory cell groups, the first operation including
            receiving first data of 1 bit per memory cell from an outside, and
            setting threshold voltages of a plurality of memory cells such that two separated first distributions corresponding to the first data are formed in a first section on a lowest voltage side in the $2^N$ sections,
        perform, after the first operation on the plurality of memory cell groups, a second operation on a memory cell group connected to each of two second word lines adjacent to each other in the plurality of first word lines, the second operation including
            reading, on the basis of the two first distributions, second data of 1 bit per memory cell from a memory cell group connected to a fourth word line which is a first word line three or more away from a third word line which is one of the two second word lines in the plurality of first word lines,
            receiving third data of M (where 1+M<N) bits per memory cell from an outside, and
            setting threshold voltages of a plurality of memory cells included in a memory cell group connected to the third word line such that $2^{(1+M)}$ second distributions corresponding to fourth data of (1+M) bits are separately formed two by two per memory cell including the second data and the third data, and
        perform, after the second operation on a memory cell group connected to each of the two second word lines, a third operation on a memory cell group connected to a fifth word line which is one of the two second word lines, the third operation including
            reading fifth data of 1 bit per memory cell on the basis of the two first distributions from a sixth word line which is a first word line three or more away from the fifth word line in the plurality of first word lines,
reading, from the fifth word line, sixth data of M bits per memory cell on the basis of the $2^{(1+M)}$ second distributions,
receiving seventh data of (N−M−1) bits per memory cell from an outside, and
setting, for the $2^N$ sections, $2^N$ third distributions corresponding to eighth data of N bits per memory cell including the fifth data, the sixth data, and the seventh data.

2. The semiconductor memory device according to claim 1, further comprising a block including the plurality of memory cell groups and the plurality of first word lines, at least three dummy seventh word lines, and a plurality of dummy memory cell groups connected to each of the at least three dummy seventh word lines,
wherein the circuit is configured to perform the first operation on each group of the plurality of dummy memory cell groups connected to each of the at least three dummy seventh word lines.

3. The semiconductor memory device according to claim 2, wherein the circuit is configured to start the second operation on the memory cell groups connected to each of the two second word lines after the first operation is completed for all the plurality of memory cell groups connected to the plurality of first word lines and all the plurality of dummy memory cell groups connected to each of the at least three dummy seventh word lines.

4. The semiconductor memory device according to claim 3, wherein
the plurality of memory cell groups includes a first memory cell and a second memory cell which belongs to a memory cell group different from the first memory cell and shares a channel with the first memory cell,
the circuit includes a word line in the plurality of first word lines, to which the second memory cell is connected and a voltage of a first value is applied when reading is performed on the first memory cell, and
the first value is smaller than a lower limit value of the first section.

5. The semiconductor memory device according to claim 2, wherein
the plurality of memory cell groups includes a first memory cell and a second memory cell which belongs to a memory cell group different from the first memory cell and shares a channel with the first memory cell,
the circuit includes a word line in the plurality of first word lines, to which the second memory cell is connected and a voltage of a first value is applied when reading is performed on the first memory cell, and
the first value is smaller than a lower limit value of the first section.

6. The semiconductor memory device according to claim 1, wherein the circuit is configured to start the second operation on the memory cell groups connected to each of the two second word lines after the first operation is completed for all the plurality of memory cell groups connected to the plurality of first word lines.

7. The semiconductor memory device according to claim 6, wherein
the plurality of memory cell groups includes a first memory cell and a second memory cell which belongs to a memory cell group different from the first memory cell and shares a channel with the first memory cell,
the circuit includes a word line in the plurality of first word lines, to which the second memory cell is connected and a voltage of a first value is applied when reading is performed on the first memory cell, and
the first value is smaller than a lower limit value of the first section.

8. The semiconductor memory device according to claim 1, wherein
the plurality of memory cell groups includes a first memory cell and a second memory cell which belongs to a memory cell group different from the first memory cell and shares a channel with the first memory cell,
the circuit includes a word line in the plurality of first word lines, to which the second memory cell is connected and a voltage of a first value is applied when reading is performed on the first memory cell, and
the first value is smaller than a lower limit value of the first section.

9. A method of controlling a memory cell array, the memory cell array including a plurality of memory cell groups and a plurality of first word lines, each memory cell serving to store data of N bits corresponding to $2^N$ sections in which a threshold voltage is set, each first word line being connected to any one of the plurality of memory cell groups, the method comprising:
performing a first operation on the plurality of memory cell groups, the first operation including
receiving first data of 1 bit per memory cell from an outside, and
setting threshold voltages of a plurality of memory cells such that two separated first distributions corresponding to the first data are formed in a first section on a lowest voltage side in the $2^N$ sections,
performing, after the first operation on the plurality of memory cell groups, a second operation on a memory cell group connected to each of two second word lines adjacent to each other in the plurality of first word lines, the second operation including
reading, on the basis of the two first distributions, second data of 1 bit per memory cell from a memory cell group connected to a fourth word line which is a first word line three or more away from a third word line which is one of the two second word lines in the plurality of first word lines,
receiving third data of M (where 1+M<N) bits per memory cell from an outside, and
setting threshold voltages of a plurality of memory cells included in a memory cell group connected to the third word line such that $2^{(1+M)}$ second distributions corresponding to fourth data of (1+M) bits are separately formed two by two per memory cell including the second data and the third data; and
performing, after the second operation on a memory cell group connected to each of the two second word lines, a third operation on a memory cell group connected to a fifth word line which is one of the two second word lines, the third operation including
reading fifth data of 1 bit per memory cell on the basis of the two first distributions from a sixth word line which is a first word line three or more away from the fifth word line in the plurality of first word lines,
reading, from the fifth word line, sixth data of M bits per memory cell on the basis of the $2^{(1+M)}$ second distributions,
receiving seventh data of (N−M−1) bits per memory cell from an outside, and setting, for the $2^N$ sections, $2^N$ third distributions corresponding to eighth data of N bits per memory cell including the fifth data, the sixth data, and the seventh data in the $2^N$ sections.

10. The method according to claim 9, wherein
the memory cell array includes a block including the plurality of memory cell groups and the plurality of first word lines, at least three dummy seventh word lines, and a plurality of dummy memory cell groups connected to each of the at least three dummy seventh word lines, and
the method further comprises performing the first operation on each group of the plurality of dummy memory cell groups connected to each of the at least three dummy seventh word lines.

11. The method according to claim 10, further comprising starting the second operation on the memory cell groups connected to each of the two second word lines after the first operation is completed for all the plurality of memory cell groups connected to the plurality of first word lines and all the plurality of dummy memory cell groups connected to each of the at least three dummy seventh word lines.

12. The method according to claim 11, wherein
the plurality of memory cell groups includes a first memory cell and a second memory cell which belongs to a memory cell group different from the first memory cell and shares a channel with the first memory cell,
the method further comprises, when reading is performed on the first memory cell, applying a voltage of a first value to a word line in the plurality of first word lines, to which the second memory cell is connected, and
the first value is smaller than a lower limit value of the first section.

13. The method according to claim 10, wherein
the plurality of memory cell groups includes a first memory cell and a second memory cell which belongs to a memory cell group different from the first memory cell and shares a channel with the first memory cell,
the method further comprises, when reading is performed on the first memory cell, applying a voltage of a first value to a word line in the plurality of first word lines, to which the second memory cell is connected, and
the first value is smaller than a lower limit value of the first section.

14. The method according to claim 9, further comprising starting the second operation on the memory cell groups connected to each of the two second word lines after the first operation is completed for all the plurality of memory cell groups connected to the plurality of first word lines.

15. The method according to claim 14, wherein
the plurality of memory cell groups includes a first memory cell and a second memory cell which belongs to a memory cell group different from the first memory cell and shares a channel with the first memory cell,
the method further comprises, when reading is performed on the first memory cell, applying a voltage of a first value to a word line in the plurality of first word lines, to which the second memory cell is connected, and
the first value is smaller than a lower limit value of the first section.

16. The method according to claim 9, wherein
the plurality of memory cell groups includes a first memory cell and a second memory cell which belongs to a memory cell group different from the first memory cell and shares a channel with the first memory cell,
the method further comprises, when reading is performed on the first memory cell, applying a voltage of a first value to a word line in the plurality of first word lines, to which the second memory cell is connected, and
the first value is smaller than a lower limit value of the first section.

* * * * *